(12) United States Patent
Tong et al.

(10) Patent No.: US 9,500,325 B2
(45) Date of Patent: Nov. 22, 2016

(54) LED LAMP INCORPORATING REMOTE PHOSPHOR WITH HEAT DISSIPATION FEATURES

(75) Inventors: Tao Tong, Oxnard, CA (US); Ronan Letoquin, Fremont, CA (US); Bernd Keller, Santa Barbara, CA (US); Eric Tarsa, Goleta, CA (US)

(73) Assignee: CREE, INC., Durham, NC (US)

( * ) Notice: Subject to any disclaimer, the term of this patent is extended or adjusted under 35 U.S.C. 154(b) by 230 days.

(21) Appl. No.: 13/029,025

(22) Filed: Feb. 16, 2011

(65) Prior Publication Data
US 2011/0215701 A1 Sep. 8, 2011

Related U.S. Application Data

(63) Continuation-in-part of application No. 12/848,825, filed on Aug. 2, 2010, now Pat. No. 8,562,161.

(60) Provisional application No. 61/339,516, filed on Mar. 3, 2010, provisional application No. 61/339,515, filed (Continued)

(51) Int. Cl.
*F21V 9/00* (2015.01)
*F21K 99/00* (2016.01)
(Continued)

(52) U.S. Cl.
CPC . *F21K 9/56* (2013.01); *F21K 9/00* (2013.01); *F21V 29/004* (2013.01); *F21V 29/75* (2015.01);
(Continued)

(58) Field of Classification Search
CPC ..... F21V 29/70; F21V 29/004; F21V 23/005

USPC .................................................. 362/293, 294
See application file for complete search history.

(56) References Cited

U.S. PATENT DOCUMENTS 2,394,992 A 2/1946 Franck ..................... 362/311.12
3,143,592 A 8/1964 August ........................ 174/16.3
(Continued)

FOREIGN PATENT DOCUMENTS

CN 1425117 6/2003
CN 1465106 A 12/2003
(Continued)

OTHER PUBLICATIONS

International Search Report and Written Opinion for PCT Patent Application No. PCT/US2011/000405 mailed Nov. 2, 2011.
(Continued)

*Primary Examiner* — William Carter
(74) *Attorney, Agent, or Firm* — Koppel, Patrick, Heybl & Philpott

(57) ABSTRACT

An LED lamp or bulb is disclosed that comprises a light source, a heat sink structure and a remote planar phosphor carrier having at least one conversion material. The phosphor carrier can be remote to the light sources and mounted to the heat sink so that heat from the phosphor carrier spreads into the heat sink. The phosphor carrier can comprise a thermally conductive transparent material and a phosphor layer, with an LED based light source mounted to the heat sink such that light from the light source passes through the phosphor carrier. At least some of the LED light is converted by the phosphor carrier, with some lamp embodiments emitting a white light combination of LED and phosphor light. The phosphor arranged according to the present invention can operate at lower temperature to thereby operate at greater phosphor conversion efficiency and with reduced heat related damage to the phosphor.

23 Claims, 5 Drawing Sheets

Related U.S. Application Data on Mar. 3, 2010, provisional application No. 61/386,437, filed on Sep. 24, 2010, provisional application No. 61/424,665, filed on Dec. 19, 2010, provisional application No. 61/424,670, filed on Dec. 19, 2010, provisional application No. 61/434,355, filed on Jan. 19, 2011, provisional application No. 61/435,326, filed on Jan. 23, 2011, provisional application No. 61/435,759, filed on Jan. 24, 2011.

(51) Int. Cl.

| | | |
|---|---|---|
| *F21V 29/76* | (2015.01) | |
| *F21V 29/00* | (2015.01) | |
| *H01L 33/64* | (2010.01) | |
| *F21V 29/75* | (2015.01) | |
| *F21Y 101/02* | (2006.01) | |
| *F21Y 105/00* | (2016.01) | |
| *F21V 29/85* | (2015.01) | |

(52) U.S. Cl.
CPC ............. *F21V 29/76* (2015.01); *F21V 29/767* (2015.01); *H01L 33/644* (2013.01); *F21V 29/006* (2013.01); *F21V 29/85* (2015.01); *F21Y 2101/02* (2013.01); *F21Y 2105/001* (2013.01); *H01L 2224/48091* (2013.01); *H01L 2224/48247* (2013.01); *H01L 2224/73265* (2013.01)

(56) References Cited

U.S. PATENT DOCUMENTS

| | | | |
|---|---|---|---|
| 3,581,162 A | 5/1971 | Wheatley | |
| 4,204,246 A | 5/1980 | Arii et al. ..................... 361/699 | |
| 4,219,871 A * | 8/1980 | Larrimore ............... B63B 45/04 | |
| | | | 362/264 |
| 5,463,280 A | 10/1995 | Johnson | |
| 5,535,230 A | 7/1996 | Abe | |
| 5,561,346 A | 10/1996 | Byrne | |
| 5,581,683 A | 12/1996 | Bertignoll et al. | |
| 5,585,783 A | 12/1996 | Hall | |
| 5,655,830 A | 8/1997 | Ruskouski | |
| 5,688,042 A | 11/1997 | Madadi et al. | |
| 5,806,965 A | 9/1998 | Deese | |
| 5,838,101 A | 11/1998 | Pappalardo ................. 313/487 |
| 5,890,794 A | 4/1999 | Abtahi et al. | |
| 5,934,798 A | 8/1999 | Roller et al. ................. 362/497 |
| 5,947,588 A | 9/1999 | Huang | |
| 5,949,347 A | 9/1999 | Wu | |
| 6,218,785 B1 | 4/2001 | Incerti ........................ 315/185 S |
| 6,220,722 B1 | 4/2001 | Begemann | |
| 6,220,731 B1 | 4/2001 | Ryan ............................ 362/373 |
| 6,227,679 B1 | 5/2001 | Zhang et al. | |
| 6,234,648 B1 | 5/2001 | Borner et al. | |
| 6,250,774 B1 | 6/2001 | Begemann et al. | |
| 6,270,722 B1 | 8/2001 | Yang et al. ..................... 422/37 |
| 6,276,822 B1 | 8/2001 | Bedrosian et al. | |
| 6,350,041 B1 | 2/2002 | Tarsa | |
| 6,404,131 B1 | 6/2002 | Kawano et al. ................ 315/82 |
| 6,465,961 B1 | 10/2002 | Cao .............................. 315/58 |
| 6,517,221 B1 | 2/2003 | Xie .............................. 362/373 |
| 6,523,978 B1 | 2/2003 | Huang | |
| 6,550,953 B1 | 4/2003 | Ichikawa et al. | |
| 6,634,770 B2 | 10/2003 | Cao | |
| 6,659,632 B2 | 12/2003 | Chen | |
| 6,709,132 B2 | 3/2004 | Ishibashi | |
| 6,746,885 B2 | 6/2004 | Cao .............................. 438/26 |
| 6,758,582 B1 | 7/2004 | Hsiao .......................... 362/302 |
| 6,764,202 B1 | 7/2004 | Herring et al. ............... 362/371 |
| 6,803,607 B1 | 10/2004 | Chan et al. | |
| 6,848,819 B1 | 2/2005 | Arndt et al. | |
| 6,860,620 B2 | 3/2005 | Kuan et al. ................... 362/294 |
| 6,864,513 B2 | 3/2005 | Lin et al. | |
| 6,910,794 B2 | 6/2005 | Rice .............................. 362/547 |
| 6,948,829 B2 | 9/2005 | Verdes et al. | |
| 6,982,518 B2 | 1/2006 | Chou et al. | |
| 6,997,580 B2 | 2/2006 | Wong ........................ 362/311.02 |
| 7,048,412 B2 | 5/2006 | Martin et al. | |
| 7,080,924 B2 | 7/2006 | Tseng et al. | |
| 7,086,756 B2 | 8/2006 | Maxik | |
| 7,086,767 B2 | 8/2006 | Sidwell et al. | |
| 7,094,362 B2 | 8/2006 | Setlur et al. .................. 252/301 |
| 7,140,753 B2 | 11/2006 | Wang et al. .................. 362/294 |
| 7,144,135 B2 | 12/2006 | Martin et al. | |
| 7,160,012 B2 | 1/2007 | Hilscher et al. | |
| 7,160,120 B2 | 1/2007 | Zhang et al. | |
| 7,165,866 B2 | 1/2007 | Li | |
| 7,172,314 B2 | 2/2007 | Currie et al. | |
| 7,213,940 B1 | 5/2007 | Van de Ven ..................... 257/89 |
| D546,980 S | 7/2007 | Lo | |
| 7,250,715 B2 | 7/2007 | Mueller ......................... 313/485 |
| 7,270,446 B2 | 9/2007 | Chang et al. ................ 362/294 |
| D553,267 S | 10/2007 | Yuen | |
| 7,350,936 B2 | 4/2008 | Ducharme et al. ............ 362/231 |
| 7,354,174 B1 | 4/2008 | Yan | |
| 7,377,674 B2 | 5/2008 | Klinkman et al. ............. 362/484 |
| 7,396,142 B2 | 7/2008 | Laizure, Jr. et al. | |
| 7,405,857 B2 | 7/2008 | Ma et al. | |
| 7,413,325 B2 | 8/2008 | Chen ........................ 362/249.01 |
| D581,556 S | 11/2008 | To et al. ........................... D26/2 |
| 7,547,124 B2 | 6/2009 | Chang et al. ................ 362/373 |
| 7,549,782 B2 | 6/2009 | Ng et al. ....................... 362/555 |
| 7,553,047 B2 * | 6/2009 | Shin et al. .................... 362/294 |
| 7,600,882 B1 | 10/2009 | Morejon et al. | |
| 7,607,802 B2 | 10/2009 | Kang et al. .................. 362/294 |
| 7,614,759 B2 | 11/2009 | Negley | |
| 7,618,157 B1 | 11/2009 | Galvez | |
| 7,663,315 B1 | 2/2010 | Hulse | |
| 7,686,478 B1 | 3/2010 | Hulse | |
| 7,710,016 B2 | 5/2010 | Miki .............................. 257/98 |
| 7,726,836 B2 | 6/2010 | Chen | |
| 7,740,365 B2 | 6/2010 | Huttner et al. ................. 362/97 |
| 7,753,568 B2 | 7/2010 | Hu et al. ...................... 362/373 |
| 7,810,954 B2 | 10/2010 | Kolodin ....................... 362/277 |
| 7,824,065 B2 | 11/2010 | Maxik | |
| D629,928 S | 12/2010 | Chen | |
| 7,884,538 B2 | 2/2011 | Mitsuishi et al. ............. 313/502 |
| 7,909,481 B1 | 3/2011 | Zhang ....................... 362/249.02 |
| 7,976,335 B2 | 7/2011 | Weber et al. ................. 439/487 |
| 7,989,236 B2 | 8/2011 | Yamaguchi et al. ........... 438/26 |
| 8,021,025 B2 | 9/2011 | Lee | |
| 8,235,571 B2 | 8/2012 | Park ............................ 362/555 |
| 8,253,316 B2 | 8/2012 | Sun et al. | |
| 8,272,762 B2 | 9/2012 | Maxik et al. | |
| 8,274,241 B2 | 9/2012 | Guest et al. | |
| 8,277,082 B2 | 10/2012 | Dassanayake et al. | |
| 8,282,250 B1 | 10/2012 | Dassanayake et al. | |
| 8,292,468 B2 | 10/2012 | Narendran et al. | |
| 8,309,969 B2 | 11/2012 | Suehiro et al. ................. 257/79 |
| 8,314,537 B2 | 11/2012 | Gielen et al. .................. 313/46 |
| 8,322,896 B2 | 12/2012 | Falicoff et al. | |
| 8,348,470 B2 | 1/2013 | Liu et al. ...................... 362/294 |
| 8,371,722 B2 | 2/2013 | Carroll | |
| 8,400,051 B2 | 3/2013 | Hakata et al. | |
| 8,410,512 B2 | 4/2013 | Andrews ........................ 257/99 |
| 8,415,865 B2 | 4/2013 | Liang et al. | |
| 8,421,320 B2 | 4/2013 | Chuang | |
| 8,421,321 B2 | 4/2013 | Chuang | |
| 8,421,322 B2 | 4/2013 | Carroll et al. | |
| 8,449,154 B2 | 5/2013 | Uemoto et al. | |
| 8,502,468 B2 | 8/2013 | Li et al. | |
| 8,568,009 B2 | 10/2013 | Chiang et al. ................ 362/563 |
| 8,641,237 B2 | 2/2014 | Chuang | |
| 8,653,723 B2 | 2/2014 | Cao et al. | |
| 8,696,168 B2 | 4/2014 | Li et al. | |
| 8,740,415 B2 | 6/2014 | Wheelock | |
| 8,750,671 B1 | 6/2014 | Kelly et al. | |
| 8,752,984 B2 | 6/2014 | Lenk et al. | |
| 8,760,042 B2 | 6/2014 | Sakai et al. | |
| 8,922,106 B2 | 12/2014 | Helbing et al. .......... 313/318.11 |
| 9,316,386 B2 | 4/2016 | Breidenassel | |
| 2002/0047516 A1 | 4/2002 | Iwasa et al. .................. 313/512 |
| 2002/0114169 A1 | 8/2002 | Harada ......................... 362/558 |

(56) References Cited

U.S. PATENT DOCUMENTS

| | | | |
|---|---|---|---|
| 2003/0021113 A1 | 1/2003 | Begemann | |
| 2003/0038291 A1 | 2/2003 | Cao | |
| 2003/0081419 A1 | 5/2003 | Jacob | 362/364 |
| 2003/0185005 A1 | 10/2003 | Sommers et al. | |
| 2004/0021629 A1 | 2/2004 | Sasuga et al. | |
| 2004/0159846 A1 | 8/2004 | Doxsee | |
| 2004/0201990 A1 | 10/2004 | Neyer | |
| 2004/0223315 A1 | 11/2004 | Suehiro et al. | 362/84 |
| 2005/0068776 A1 | 3/2005 | Ge | 362/296.08 |
| 2005/0168990 A1 | 8/2005 | Nagata et al. | 362/294 |
| 2005/0174780 A1 | 8/2005 | Park | 362/294 |
| 2005/0184638 A1 | 8/2005 | Mueller | 313/485 |
| 2005/0219060 A1 | 10/2005 | Curran et al. | 340/815.45 |
| 2005/0225988 A1 | 10/2005 | Chaves et al. | |
| 2005/0242711 A1 | 11/2005 | Bloomfield | |
| 2005/0276053 A1 | 12/2005 | Nortrup et al. | 362/294 |
| 2006/0097245 A1 | 5/2006 | Aanegola et al. | 257/26 |
| 2006/0097385 A1 | 5/2006 | Negley | 257/722 |
| 2006/0105482 A1 | 5/2006 | Alferink et al. | 438/22 |
| 2006/0138435 A1 | 6/2006 | Tarsa et al. | 257/89 |
| 2006/0152140 A1 | 7/2006 | Brandes | 313/503 |
| 2006/0152820 A1 | 7/2006 | Lien et al. | 359/726 |
| 2006/0180774 A1* | 8/2006 | Endo | 250/485.1 |
| 2006/0227558 A1 | 10/2006 | Osawa et al. | |
| 2006/0250792 A1 | 11/2006 | Izardel | 362/231 |
| 2007/0047232 A1 | 3/2007 | Kim et al. | |
| 2007/0090737 A1 | 4/2007 | Hu et al. | 313/11 |
| 2007/0091633 A1 | 4/2007 | Harrity et al. | |
| 2007/0139938 A1 | 6/2007 | Petroski | |
| 2007/0139949 A1 | 6/2007 | Tanda et al. | 362/551 |
| 2007/0158668 A1 | 7/2007 | Tarsa et al. | 257/98 |
| 2007/0182299 A1 | 8/2007 | Ouderkirk | 313/110 |
| 2007/0206375 A1 | 9/2007 | Lys | |
| 2007/0215890 A1 | 9/2007 | Harbers et al. | |
| 2007/0223219 A1 | 9/2007 | Medendorp | |
| 2007/0263405 A1 | 11/2007 | Ng et al. | 362/555 |
| 2007/0267976 A1 | 11/2007 | Bohler et al. | 315/112 |
| 2007/0274080 A1 | 11/2007 | Negley et al. | 362/341 |
| 2007/0285924 A1 | 12/2007 | Morris et al. | 362/264 |
| 2007/0297183 A1 | 12/2007 | Coushaine | |
| 2008/0037257 A1 | 2/2008 | Bolta | |
| 2008/0055908 A1 | 3/2008 | Wu et al. | 362/294 |
| 2008/0062694 A1 | 3/2008 | Lai et al. | 362/294 |
| 2008/0080165 A1 | 4/2008 | Kim et al. | |
| 2008/0093615 A1 | 4/2008 | Lin et al. | |
| 2008/0106893 A1 | 5/2008 | Johnson et al. | |
| 2008/0117620 A1* | 5/2008 | Hama et al. | 362/84 |
| 2008/0128735 A1 | 6/2008 | Yoo et al. | |
| 2008/0149166 A1 | 6/2008 | Beeson et al. | 136/248 |
| 2008/0173884 A1 | 7/2008 | Chitnis et al. | 257/98 |
| 2008/0179611 A1 | 7/2008 | Chitnis et al. | 257/98 |
| 2008/0232119 A1 | 9/2008 | Ribarich | 362/373 |
| 2008/0285279 A1 | 11/2008 | Ng et al. | 362/249 |
| 2008/0308825 A1 | 12/2008 | Chakraborty et al. | 257/98 |
| 2009/0001399 A1* | 1/2009 | Diana et al. | 257/98 |
| 2009/0015137 A1 | 1/2009 | Su et al. | 313/503 |
| 2009/0040760 A1 | 2/2009 | Chen et al. | 362/249 |
| 2009/0046473 A1 | 2/2009 | Tsai et al. | 362/373 |
| 2009/0058256 A1 | 3/2009 | Mitsuishi et al. | 313/487 |
| 2009/0059559 A1 | 3/2009 | Pabst | |
| 2009/0067180 A1 | 3/2009 | Tahmosybayat | 362/339 |
| 2009/0086492 A1 | 4/2009 | Meyer | |
| 2009/0086508 A1 | 4/2009 | Bierhuizen | 362/617 |
| 2009/0095960 A1* | 4/2009 | Murayama | 257/79 |
| 2009/0101930 A1 | 4/2009 | Li | |
| 2009/0103293 A1 | 4/2009 | Harbers et al. | |
| 2009/0103296 A1 | 4/2009 | Harbers et al. | |
| 2009/0116217 A1 | 5/2009 | Teng et al. | |
| 2009/0140633 A1 | 6/2009 | Tanimoto | 313/503 |
| 2009/0141474 A1 | 6/2009 | Kolodin | |
| 2009/0175041 A1 | 7/2009 | Yuen et al. | |
| 2009/0184618 A1 | 7/2009 | Hakata et al. | |
| 2009/0190353 A1 | 7/2009 | Barker | 362/249 |
| 2009/0195186 A1 | 8/2009 | Guest et al. | 315/294 |
| 2009/0201679 A1 | 8/2009 | Konaka | 362/235 |
| 2009/0208307 A1 | 8/2009 | Haase | 362/234 |
| 2009/0217970 A1 | 9/2009 | Zimmerman et al. | 136/252 |
| 2009/0262516 A1 | 10/2009 | Li | 362/84 |
| 2009/0273727 A1 | 11/2009 | Kubota et al. | 349/62 |
| 2009/0273924 A1 | 11/2009 | Chiang | 362/241 |
| 2009/0283779 A1 | 11/2009 | Negley et al. | 257/88 |
| 2009/0286337 A1 | 11/2009 | Lee | 438/27 |
| 2009/0296387 A1 | 12/2009 | Reisenauer et al. | 362/235 |
| 2009/0310368 A1 | 12/2009 | Incerti | 362/326 |
| 2009/0316073 A1 | 12/2009 | Chen et al. | 349/64 |
| 2009/0316383 A1 | 12/2009 | Son | |
| 2009/0322197 A1 | 12/2009 | Helbing | |
| 2009/0322208 A1* | 12/2009 | Shaikevitch et al. | 313/503 |
| 2009/0322800 A1 | 12/2009 | Atkins | 345/690 |
| 2009/0323333 A1 | 12/2009 | Chang | |
| 2009/3233333 | 12/2009 | Chang | |
| 2010/0014839 A1 | 1/2010 | Benoy et al. | 386/117 |
| 2010/0020547 A1 | 1/2010 | Olsson | 362/311 |
| 2010/0025700 A1 | 2/2010 | Jung et al. | |
| 2010/0026185 A1 | 2/2010 | Betsuda et al. | 315/32 |
| 2010/0027258 A1 | 2/2010 | Maxik et al. | 362/240 |
| 2010/0038660 A1 | 2/2010 | Shuja | 257/98 |
| 2010/0046231 A1 | 2/2010 | Medinis | 362/294 |
| 2010/0060144 A1 | 3/2010 | Justel et al. | 313/503 |
| 2010/0079061 A1 | 4/2010 | Tsai | 313/504 |
| 2010/0091487 A1 | 4/2010 | Shin | 362/235 |
| 2010/0096967 A1 | 4/2010 | Marinus et al. | 313/46 |
| 2010/0102707 A1 | 4/2010 | Fukuda et al. | 313/503 |
| 2010/0134047 A1 | 6/2010 | Hasnain | |
| 2010/0140655 A1* | 6/2010 | Shi | 257/99 |
| 2010/0149783 A1 | 6/2010 | Takenaka et al. | 362/84 |
| 2010/0149814 A1 | 6/2010 | Zhai et al. | 257/88 |
| 2010/0155763 A1 | 6/2010 | Donofrio | |
| 2010/0170075 A1 | 7/2010 | Kanade et al. | 29/428 |
| 2010/0177522 A1 | 7/2010 | Lee | 362/373 |
| 2010/0201284 A1 | 8/2010 | Kraus | |
| 2010/0207502 A1 | 8/2010 | Cao et al. | 313/46 |
| 2010/0219735 A1 | 9/2010 | Sakai et al. | 313/46 |
| 2010/0232134 A1 | 9/2010 | Tran | 362/84 |
| 2010/0244729 A1 | 9/2010 | Chen et al. | 315/291 |
| 2010/0246165 A1 | 9/2010 | Diaz et al. | 362/183 |
| 2010/0259918 A1 | 10/2010 | Rains, Jr. | 362/84 |
| 2010/0264799 A1 | 10/2010 | Liu et al. | 313/46 |
| 2010/0264826 A1 | 10/2010 | Yatsuda | 315/112 |
| 2010/0314985 A1 | 12/2010 | Premysler | 313/46 |
| 2010/0327745 A1 | 12/2010 | Dassanayake | 315/35 |
| 2010/0327755 A1 | 12/2010 | Dassanayake | 315/35 |
| 2010/0328925 A1 | 12/2010 | Hoelen | 362/84 |
| 2011/0037368 A1 | 2/2011 | Huang | 313/46 |
| 2011/0044022 A1 | 2/2011 | Ko et al. | 362/84 |
| 2011/0058379 A1 | 3/2011 | Diamantidis | |
| 2011/0068356 A1 | 3/2011 | Chiang | 257/98 |
| 2011/0074271 A1 | 3/2011 | Takeshi et al. | 313/46 |
| 2011/0074296 A1 | 3/2011 | Shen et al. | |
| 2011/0080096 A1 | 4/2011 | Dudik et al. | 315/112 |
| 2011/0080740 A1 | 4/2011 | Allen | 362/294 |
| 2011/0089804 A1 | 4/2011 | Mahalingam et al. | |
| 2011/0089830 A1 | 4/2011 | Pickard et al. | 315/32 |
| 2011/0095686 A1 | 4/2011 | Falicoff et al. | 315/35 |
| 2011/0133222 A1 | 6/2011 | Allen et al. | 257/88 |
| 2011/0149563 A1 | 6/2011 | Hsia | 362/221 |
| 2011/0149585 A1 | 6/2011 | Niiyama | 362/294 |
| 2011/0175528 A1 | 7/2011 | Rains et al. | 315/51 |
| 2011/0176316 A1 | 7/2011 | Phipps et al. | |
| 2011/0205733 A1 | 8/2011 | Lenderink et al. | 362/231 |
| 2011/0215696 A1 | 9/2011 | Tong et al. | 313/46 |
| 2011/0216523 A1 | 9/2011 | Tong et al. | 362/84 |
| 2011/0242816 A1 | 10/2011 | Chowdhury et al. | 362/294 |
| 2011/0267835 A1 | 11/2011 | Boonekamp et al. | 362/555 |
| 2011/0273072 A1 | 11/2011 | Oki | 313/46 |
| 2011/0278609 A1 | 11/2011 | Jeong | 257/98 |
| 2011/0291560 A1 | 12/2011 | Wang et al. | 315/32 |
| 2011/0298371 A1 | 12/2011 | Brandes et al. | 315/32 |
| 2012/0040585 A1 | 2/2012 | Huang | |
| 2012/0155059 A1 | 6/2012 | Hoelen et al. | 362/84 |
| 2012/0161626 A1 | 6/2012 | Van de Ven et al. | 315/35 |
| 2012/0241778 A1 | 9/2012 | Franck | 257/88 |
| 2012/0320591 A1 | 12/2012 | Liao et al. | 362/249 |
| 2013/0049018 A1 | 2/2013 | Ramer et al. | 257/81 |

(56) References Cited

U.S. PATENT DOCUMENTS

| | | | |
|---|---|---|---|
| 2013/0063945 A1 | 3/2013 | Wu et al. | 362/249 |
| 2013/0119280 A1 | 5/2013 | Fuchi et al. | 250/504 R |
| 2013/0249374 A1 | 9/2013 | Lee et al. | 313/12 |
| 2013/0293098 A1 | 11/2013 | Li et al. | 313/512 |

FOREIGN PATENT DOCUMENTS

| | | |
|---|---|---|
| CN | 1608326 | 4/2005 |
| CN | 1726410 | 1/2006 |
| CN | 1802533 | 7/2006 |
| CN | 1922286 A | 2/2007 |
| CN | 101128695 | 2/2008 |
| CN | 10126232 A | 9/2008 |
| CN | 101262032 | 9/2008 |
| CN | 1013388887 A | 1/2009 |
| CN | 101368719 A | 2/2009 |
| CN | 10164162 3 | 3/2010 |
| CN | 102077011 | 5/2011 |
| DE | 10251955 | 5/2004 |
| DE | 10251955 A1 | 5/2004 |
| DE | 102004051382 | 4/2006 |
| DE | 102006061164 | 6/2008 |
| DE | 10 2007 037862 A1 | 10/2008 |
| DE | 202008013667 | 12/2008 |
| DE | 102011004718 | 8/2012 |
| EP | 0876085 | 11/1998 |
| EP | 0876085 A2 | 11/1998 |
| EP | 0890059 A1 | 1/1999 |
| EP | 1058221 A2 | 12/2000 |
| EP | 1881259 | 1/2008 |
| EP | 2146135 A2 | 1/2010 |
| EP | 2154420 | 2/2010 |
| EP | 2469154 | 6/2012 |
| FR | 2941346 | 7/2010 |
| GB | 2345954 A | 7/2000 |
| GB | 2 366 610 A | 3/2002 |
| GB | 2366610 | 3/2002 |
| GB | 2366610 A | 3/2002 |
| JP | H03081903 | 4/1991 |
| JP | H06283006 | 10/1994 |
| JP | H09265807 | 10/1997 |
| JP | H11177149 | 7/1999 |
| JP | 11-213730 A | 8/1999 |
| JP | H11260125 | 9/1999 |
| JP | 2000022222 | 1/2000 |
| JP | 2000173304 | 6/2000 |
| JP | 2001118403 | 4/2001 |
| JP | 2002525814 | 8/2002 |
| JP | 2003515899 | 5/2003 |
| JP | 2004146225 | 5/2004 |
| JP | 2004241318 | 8/2004 |
| JP | 2005-093097 A | 4/2005 |
| JP | 2005108700 | 4/2005 |
| JP | 20051008700 | 4/2005 |
| JP | 2005244226 | 9/2005 |
| JP | 2005-286267 A | 10/2005 |
| JP | 2005277127 | 10/2005 |
| JP | 2005021635 | 11/2005 |
| JP | 2006019676 | 1/2006 |
| JP | 2006108661 | 4/2006 |
| JP | 2006148147 | 6/2006 |
| JP | 2006156187 | 6/2006 |
| JP | 20066159187 | 6/2006 |
| JP | WO 2006065558 | 6/2006 |
| JP | 200640850 A | 9/2006 |
| JP | 2006525648 | 11/2006 |
| JP | 2006331683 | 12/2006 |
| JP | 2007049019 | 2/2007 |
| JP | A2007049019 | 2/2007 |
| JP | 200759930 | 3/2007 |
| JP | 2007059911 | 3/2007 |
| JP | 2007081090 | 3/2007 |
| JP | 2007184330 | 7/2007 |
| JP | 3138653 | 12/2007 |
| JP | 2008505448 | 2/2008 |
| JP | 2008508742 | 3/2008 |
| JP | 2008091140 | 4/2008 |
| JP | 2008108835 | 5/2008 |
| JP | 2008523639 | 7/2008 |
| JP | 2008187195 | 8/2008 |
| JP | 2008262765 | 10/2008 |
| JP | 200828183 | 11/2008 |
| JP | 2008288409 | 11/2008 |
| JP | 2008300117 | 12/2008 |
| JP | 2008300203 | 12/2008 |
| JP | 2008300460 | 12/2008 |
| JP | 2008300570 | 12/2008 |
| JP | 2009-016058 A | 1/2009 |
| JP | 2009016058 | 1/2009 |
| JP | 2009016153 | 1/2009 |
| JP | 2009021264 | 1/2009 |
| JP | 2009059896 | 3/2009 |
| JP | 2009117346 | 5/2009 |
| JP | WO 2009093163 | 7/2009 |
| JP | U3153766 | 8/2009 |
| JP | 2009238960 | 10/2009 |
| JP | WO 2009119038 | 10/2009 |
| JP | 2009266780 | 11/2009 |
| JP | 2009277586 | 11/2009 |
| JP | 2009295299 | 12/2009 |
| JP | WO 2009148543 | 12/2009 |
| JP | 2010016223 | 1/2010 |
| JP | 2010040494 | 2/2010 |
| JP | 2010050473 | 3/2010 |
| JP | 2010129300 | 6/2010 |
| JP | 2010267826 | 11/2010 |
| KR | WO 2009028861 | 3/2009 |
| KR | 100944181 | 2/2010 |
| KR | 1020100037353 | 4/2010 |
| KR | 100980588 B1 | 9/2010 |
| KR | 3020110008445 | 3/2011 |
| TW | 200505054 | 2/2005 |
| TW | 200507686 | 2/2005 |
| TW | 200527664 | 8/2005 |
| TW | 200618339 | 6/2006 |
| TW | 200619744 | 6/2006 |
| TW | M309750 | 4/2007 |
| TW | 200739151 | 10/2007 |
| TW | 200806922 | 2/2008 |
| TW | 200907239 | 2/2009 |
| TW | 200928435 | 7/2009 |
| TW | 200930937 | 7/2009 |
| TW | 200938768 | 9/2009 |
| TW | 200943592 | 10/2009 |
| TW | D134005 | 3/2010 |
| TW | 100300960 | 3/2011 |
| TW | D141681 | 7/2011 |
| WO | WO 00/17569 A1 | 3/2000 |
| WO | WO 0124583 A1 | 4/2001 |
| WO | WO 01/40702 A1 | 6/2001 |
| WO | WO 0160119 A2 | 8/2001 |
| WO | WO 2004100213 A2 | 5/2004 |
| WO | WO 2004068599 | 8/2004 |
| WO | WO 2004100213 | 11/2004 |
| WO | WO 2004100213 A2 | 11/2004 |
| WO | WO 2005107420 A2 | 11/2005 |
| WO | WO 2006012043 | 2/2006 |
| WO | WO 2006065558 | 6/2006 |
| WO | WO 2007/130358 A2 | 11/2007 |
| WO | WO 2007146566 A2 | 12/2007 |
| WO | WO 2008/018002 A2 | 2/2008 |
| WO | WO 2008018002 | 2/2008 |
| WO | WO 2008134056 A1 | 4/2008 |
| WO | WO 2008/052318 A1 | 5/2008 |
| WO | WO 2008/117211 A1 | 10/2008 |
| WO | WO 2008/146229 A2 | 12/2008 |
| WO | WO 2008146229 | 12/2008 |
| WO | WO 2009/024952 A2 | 2/2009 |
| WO | WO 2009052099 | 4/2009 |
| WO | WO 2009/091562 A2 | 7/2009 |
| WO | WO 2009/093163 A2 | 7/2009 |
| WO | WO 2009091562 | 7/2009 |
| WO | WO 2009093163 | 7/2009 |
| WO | WO 2009093163 A2 | 7/2009 |

(56) References Cited

FOREIGN PATENT DOCUMENTS

| WO | WO 2009/107052 A1 | 9/2009 |
|---|---|---|
| WO | WO 2009107052 | 9/2009 |
| WO | WO 2009/119038 A2 | 10/2009 |
| WO | WO 2009/128004 A1 | 10/2009 |
| WO | WO 2009119038 | 10/2009 |
| WO | WO 2009125314 A2 | 10/2009 |
| WO | WO 2009131627 | 10/2009 |
| WO | WO 2009143047 A2 | 11/2009 |
| WO | WO 2009/158422 A1 | 12/2009 |
| WO | WO 2009158422 | 12/2009 |
| WO | WO 2009158422 A1 | 12/2009 |
| WO | WO 2010/012999 A2 | 2/2010 |
| WO | WO 2010012999 | 2/2010 |
| WO | WO 2010013893 | 2/2010 |
| WO | WO 2010013898 A2 | 2/2010 |
| WO | WO 2010052640 | 5/2010 |
| WO | WO 2010/119618 A1 | 10/2010 |
| WO | WO 2010/128419 A1 | 11/2010 |
| WO | WO 2011100193 | 8/2011 |
| WO | WO 2011109091 A1 | 9/2011 |
| WO | WO 2011109098 | 9/2011 |
| WO | WO 2012011279 | 1/2012 |
| WO | WO 2012031533 | 3/2012 |

OTHER PUBLICATIONS

International Search Report and Written Opinion for PCT/US2011/000407 mailed Nov. 16, 2011.
Office Action of the IPO for Taiwan Patent Application No. TW 100300962 issued Nov. 21, 2011.
Office Action of the IPO for Taiwan Patent Application No. TW 100300961 issued Nov. 16, 2011.
Office Action of the IPO for Taiwan Patent Application No. TW 100300960 issued Nov. 15, 2011.
Office Action of the IPO for Taiwan Patent Application No. TW 100302770 issued Jan. 13, 2012.
U.S. Appl. No. 11/656,759, filed Jan. 22, 2007 Chitnis.
U.S. Appl. No. 11/899,790, filed Sep. 7, 2007 Chitnis.
U.S. Appl. No. 11/473,089, filed Jun. 21, 2006 Tarsa.
U.S. Appl. No. 61/435,759, filed Jan. 24, 2011 Le.
U.S. Appl. No. 61/339,516, filed Mar. 3, 2010 Tong.
International Search Report and Written Opinion, PCT/US2009/063804, Mailed on Feb. 26, 2010.
U.S. Appl. No. 12/566,195, Van De Ven.
U.S. Appl. No. 12/704,730, Van De Ven.
C.Crane GEOBULB®-II LED Light Bulb, Item #2SW, Description, p. 1-2.
C.Crane GEOBULB®-II LED Light Bulb, Item #2SW, Specs, p. 1-2.
Cree LR4, 4" Recessed Architectural Downlight, Product Info p. 1-2.
U.S. Appl. No. 12/901,405, filed Oct. 8, 2010, Tong.
U.S. Appl. No. 61/339,515, filed Mar. 3, 2010, Tong.
U.S. Appl. No. 12/848,825, filed Aug. 2, 2010, Tong.
Search Report and Written Opinion from PCT Application No. PCT/US2012/072108, dated Feb. 27, 2013.
Cree XLAMP® XP-G LED, Product Info and Data Sheet, 14 Pages.
Cree XLAMP® XP-E LED, Product Info and Date Sheet, 20 Pages.
International Search Report and Written Opinion from PCT Application No. PCT/US2011/000389, dated May 6, 2013.
International Search Report and Written Opinion from PCT Application No. PCT/US2011/000390, dated May 6, 2013.
International Preliminary Report on Patentability from PCT/US2011/00389, dated May 8, 2013.
International Preliminary Report on Patentability from PCT/US2011/000390, dated May 8, 2013.
Reasons for Rejection from Japanese Patent Appl. No. 2011-198454, dated Mar. 7, 2013.
International Search Report and Written Opinion for PCT Application No. PCT/US2011/000397 mailed May 24, 2011.
International Search Report and Written Opinion for PCT Application No. PCT/US2010/003146 mailed Jun. 7, 2011.
Notice to Submit a Response from Korean Patent Application No. 30-2011-0008448, dated Apr. 16, 2012.
Notice to Submit a Response from Korean Patent Application No. 30-2011-0008445, dated Apr. 16, 2012.
Notice to Submit a Response from Korean Patent Application No. 30-2011-0008446, dated Apr. 16, 2012.
Office Action for Taiwanese Patent Application No. 100300961, dated May 7, 2012.
Office Action from Taiwanese Patent Application No. 100300960, dated May 7, 2012.
International Search Report and Written Opinion for PCT Application No. PCT/US2011/000399 mailed Jul. 12, 2011.
Decision to Refuse a European Patent Application for EP 09 152 962.8 dated Jul. 6, 2011.
International Search Report and Written Opinion for counterpart PCT/US2011/000403 mailed Aug. 23, 2011.
International Search Report and Written Opinion for PCT/US2011/000404 mailed Aug. 25, 2011.
International Search Report and Written Opinion for PCT Application No. PCT/US2011/000391 mailed Oct. 6, 2011.
International Search Report and Written Opinion for PCT Application No. PCT/US2011/000402 mailed Sep. 30, 2011.
International Search Report and Written Opinion from PCT Application No. PCT/US2012/044705 dated Oct. 9, 2012.
Notice to Submit a Response from Korean Patent Application No. 30-2011-0008446, dated Oct. 22, 2012.
Office Action from U.S. Appl. No. 13/028,946, dated Jul. 16, 2012.
Response to OA from U.S. Appl. No. 13/028.946, filed Oct. 8, 2012.
Office Action from U.S. Appl. No. 13/430,478, dated Jun. 18, 2013.
Office Action from U.S. Appl. No. 12/901,405, dated Jul. 1, 2013.
Office Action from U.S. Appl. No. 13/018,291, dated Oct. 10, 2012.
Response to OA from U.S. Appl. No. 13/018,291, filed Jan. 7, 2013.
Office Action from U.S. Appl. No. 13/022,490, dated Nov. 7, 2012.
Response to OA from U.S. Appl. No. 13/022,490, filed Feb. 1, 2013.
Office Action from U.S. Appl. No. 13/034,501, dated Dec. 3, 2012.
Response to OA from U.S. Appl. No. 13/034,501, filed Apr. 3, 2013.
Office Action from U.S. Appl. No. 13/028,946, dated Dec. 4, 2012.
Response to OA from U.S. Appl. No. 13/028,946, filed Jan. 29, 2013.
Office Action from U.S. Appl. No. 13/029,005, dated Jan. 24, 2013.
Office Action from U.S. Appl. No. 12/901,405, dated Jan. 9, 2013.
Response to OA from U.S. Appl. No. 12/901,405, filed Apr. 29, 2013.
Office Action from U.S. Appl. No. 12/985,275, dated Feb. 28, 2013.
Response to OA from U.S. Appl. No. 12/985,275, filed May 28, 2013.
Office Action from U.S. Appl. No. 13/018,291, dated Mar. 20, 2013.
Response to OA from U.S. Appl. No. 13/018,291, filed May 20, 2013.
Office Action from U.S. Appl. No. 13/022,490, dated Apr. 2, 2013.
Office Action from U.S. Appl. No. 13/018,291, dated May 31, 2013.
Office Action from U.S. Appl. No. 12/636,958, dated Jul. 19, 2012.
Response to OA from U.S. Appl. No. 12/636,958, filed Nov. 19, 2012.
Office Action from U.S. Appl. No. 13/054,501, dated May 31, 2013.
Office Action from U.S. Appl. No. 13/028,946, filed Apr. 11, 2013.
Office Action from U.S. Appl. No. 13/028,913, dated Apr. 29, 2013.
Office Action from U.S. Appl. No. 13/029,005, dated Jan. 4, 2013.
Response to OA from U.S. Appl. No. 13/029,005, filed Apr. 17, 2013.
Office Action from U.S. Appl. No. 12/848,825, dated Nov. 5, 2012.
Response to OA from U.S. Appl. No. 12/848,825, filed Feb. 5, 2013.
Office Action from U.S. Appl. No. 13/029,005, dated Jun. 11, 2013.
Office Action from U.S. Appl. No. 13/022,490, dated Oct. 17, 2013.
Office Action from U.S. Appl. No. 11/149,999, dated May 13, 2013.
Response to OA from U.S. Appl. No. 11/149.999, filed Sep. 13, 2013.
Office Action from U.S. Appl. No. 12/985,275, dated Aug. 27, 2013.
Office Action from U.S. Appl. No. 13/358,901, dated Oct. 9, 2013.
Office Action from U.S. Appl. No. 13/028,863, dated Jul. 30, 2013.

(56) References Cited

OTHER PUBLICATIONS

Notice of Reasons for Rejection from Japanese Patent Appl. No. 2012-543086, dated Aug 27, 2013.
Office Action from U.S. Appl. No. 13/029,063, dated Oct. 23, 2013.
Office Action from U.S. Appl. No. 13/028,946, dated Oct. 31, 2013.
Office Action from U.S. Appl. No. 13/029,068, dated Nov. 15, 2013.
Notice of Reasons for Rejection from Japanese Patent Appl. No. 2012-543086, dated Dec. 24, 2013.
Office Action from Japanese Patent Appl. No. 2012-556062, dated Dec. 20, 2013.
International Preliminary Report on Patentability and Written Opinion from PCT/US2012/044705 dated Jan. 7, 2014.
Decision of Dismissal of Amendment, Decision of Rejection from Japanese Patent Appl. No. 2011-231319, dated Oct. 15, 2013.
Office Action from Japanese Patent Appl. No. 2012-556063, dated Oct. 11, 2013.
Office Action from Japanese Patent Appl. No. 2012-556066, dated Oct. 25, 2013.
Office Action from Japanese Patent Appl. No. 2012-556065, dated Oct. 25, 2013.
Office Action from Japanese Patent Appl. No. 2012-556066, dated Mar. 14, 2014.
First Office Action from Chinese Patent Application No. 2011800207069, dated May 5, 2014.
First Office Action from Chinese Patent Application No. 201180022606, dated May 4, 2014.
First Office Action from Chinese Patent Appl. No. 201180020709.2, dated May 4, 2014.
Office Action from U.S. Appl. No. 13/028,946, dated May 27, 2014.
Office Action from U.S. Appl. No. 13/028,913, dated May 22, 2014.
Office Action from U.S. Appl. No. 13/029,063, dated Apr. 1, 2014.
Office Action from U.S. Appl. No. 12/985,275, dated Apr. 10, 2014.
Office Action from U.S. Appl. No. 13/029,068, dated Apr. 24, 2014.
Office Action from U.S. Appl. No. 13/034,501, dated May 5, 2014.
Office Action from U.S. Appl. No. 13/022,490, dated May 6, 2014.
Office Action from U.S. Appl. No. 13/028,863, dated May 9, 2014.
First Office Action from Chinese Patent Appl. No. 201080062056.X, dated Feb. 12, 2014.
Office Action from U.S. Appl. No. 13/028,913, dated Feb. 19, 2014.
Office Action from U.S. Appl. No. 13/028,863, dated Mar. 4, 2014.
Office Action from U.S. Appl. No. 13/430,478, dated Feb. 21, 2014.
Office Action from U.S. Appl. No. 13/358,901, dated Mar. 6, 2014.
Office Action from U.S. Appl. No. 13/018,291, dated Mar. 7, 2014.
Office Action from Japanese Patent appl. No. 2012-556063, dated Jan. 28, 2014.
Comments on the Written Opinion and Amendment of the Application from European Patent appl. No. 12740244.4, dated Feb. 20, 2014.
International Search Report and Written Opinion from PCT/US2013/057712 dated Feb. 4, 2014.
Office Action from U.S. Appl. No. 11/149,999, dated Jan. 15, 2014.
Office Action from U.S. Appl. No. 13/034,501, dated Jan. 23, 2014.
First Office Action and Search Report from Chinese Patent Appl. No. 201180022620X, dated Jul. 1, 2014.
Office Action from U.S. Appl. No. 13/358,901, dated Jul. 15, 2014.
Response to OA from U.S. Appl. No. 13/358,901, filed Aug. 21, 2014.
Office Action from U.S. Appl. No. 13/340,478, dated Jul. 23, 2014.
Office Action from U.S. Appl. No. 14/014,272, dated Jul. 29, 2014.
Office Action from U.S. Appl. No. 12/985,275, dated Aug. 7, 2014.
Office Action from U.S. Appl. No. 12/901,405, dated Aug. 7, 2014.
Office Action from U.S. Appl. No. 13/029,068, dated Jun. 13, 2014.
Office Action from U.S. Appl. No. 13/018,245, dated Jun. 10, 2014.
Decision to Grant from Japanese Patent Appl. No. 2012-556066, dated Jul. 4, 2014.
Decision of Rejection from Japanese Patent Appl. No. 2012-556064, dated Jun. 6, 2014.
First Office Action from Chinese Patent Appl. No. 2011800223856, dated Aug. 1, 2014.
First Office Action from Chinese Patent Appl. No. 2011800226248, dated Aug. 25, 2014.
Official Action from European Patent Appl. No. 11710348.1-1757, dated Oct. 9, 2014.
Office Action from Japanese Patent Appl. No. 2012-556065, dated Aug. 5, 2014.
Office Action from Japanese Patent Appl. No. 2012-556062, dated Aug. 5, 2014.
First Office Action from Chinese Patent Appl. No. 2011800223837, dated Jul. 24, 2014.
Office Action from European Patent Appl. No. 11710906.6-1757, dated Sep. 10, 2014.
Summons to Oral Proceedings from European Patent Appl. No. 09152962/2166580, dated Jan. 29, 2015.
First Office Action from Chinese Patent Appl. No. 2011800225832, dated Jan. 20, 2015.
First Office Action from Chinese Patent Appl. No. 2011800226214, dated Dec. 25, 2014.
Second Office Action and Search Report from Chinese Patent Appl. No. 2011800207092, dated Jan. 22, 2015.
Examination Report from European Patent Appl. No. 11 710 348.1-1757, dated Feb. 18, 2015.
Examination Report from European Patent Appl. No. 11 710 906.6-1757, dated Feb. 18, 2015.
Examination Report from European Patent Appl. No. 12 740 244.4-1757, dated Feb. 9, 2015.
Office Action from U.S. Appl. No. 13/029,063, dated Jan. 13, 2015.
Office Action from U.S. Appl. No. 14/014,272, dated Jan. 14, 2015.
Response to OA from U.S. Appl. No. 14/014,272, filed Mar. 3, 2015.
Office Action from U.S. Appl. No. 12/901,405, dated Feb. 4, 2015.
Office Action from U.S. Appl. No. 13/029,068, dated Sep. 26, 2014.
Response to OA from U.S. Appl. No. 13/029,068, filed Nov. 18, 2014.
Office Action from U.S. Appl. No. 13/358,901, dated Oct. 31, 2014.
Office Action from U.S. Appl. No. 13/430,478, dated Nov. 5, 2014.
Office Action from U.S. Appl. No. 13/034,501, dated Nov. 5, 2014.
Office Action from U.S. Appl. No. 13/028,863, dated Nov. 10, 2014.
Decision to Grant from Japanese Appl. No. 2012-556062, dated Nov. 27, 2014.
Second Office Action from Chinese Patent Appl. No. 2011800207069, dated Dec. 5, 2014.
Second Office Action from Chinese Appl. No. 201080062056.X, dated Sep. 29, 2014.
First Office Action and Search Report from Chinese Appl. No. 2011800223856, dated Aug. 1, 2014.
Communication from European Appl. No. 12816621.2-1757, dated Sep. 25, 2014.
Pretrial Report from Japanese Patent Appl. No. 2011-231319, dated Apr. 14, 2014.
First Office Action from Chinese Appl. No. 201180022626.7, dated Nov. 15, 2014.
Second Office Action from Chinese Appl. No. 201180022606X, dated Dec. 23, 2014.
Appeal Decision from Japanese Appl. No. 2011-231319, dated Jan. 13, 2015.
Office Action from U.S. Appl. No. 13/607,300, dated Nov. 19, 2014.
Office Action from U.S. Appl. No. 13/018,245, dated Dec. 11, 2014.
Office Action from U.S. Appl. No. 13/029,068, dated Dec. 23, 2014.
Office Action from U.S. Appl. No. 12/985,275, dated Dec. 29, 2014.
Second Office Action from Chinese Patent Appl. No. 2011800223856, dated Apr. 16, 2015.
Office Action from Taiwanese Patent Appl. No. 100107048, dated Apr. 24, 2015.
Notice of Decline of Amendments and Final Office Action from Japanese Appl. No. 2012-556065, dated Apr. 10, 2015.
Second Office Action from Chinese Patent Appl. No. 2011800223837, dated Apr. 13, 2015.
Communication from European Patent Appl. No. 13762957.2-1757, dated Apr. 30, 2015.
Office Action and Search Report from Taiwanese Patent Appl. No. 100107051, dated May 12, 2015.
Third Office Action from Chinese Patent Appl. No. 2011800207069, dated Apr. 13, 2015.

(56) References Cited

OTHER PUBLICATIONS

Second Office Action from Chinese Patent Appl. No. 2011800226248, dated May 4, 2015.
Office Action from Taiwanese Appl. No. 100107047, dated Jun. 5, 2015.
Second Office Action from Chinese Appl. No. 201180022620X, dated Apr. 20, 2015.
Office Action from Taiwanese Appl. No. 100107040, dated Jun. 5, 2015.
Office Action from Taiwanese Patent Appl. No. 10420724800, dated Jun. 2, 2015.
Office Action from U.S. Appl. No. 13/029,068, dated Mar. 31, 2015.
Office Action from U.S. Appl. No. 11/149,999, dated Mar. 31, 2015.
Office Action from U.S. Appl. No. 12/985,275, dated Apr. 3, 2015.
Office Action from U.S. Appl. No. 13/430,478, dated Apr. 22, 2015.
Office Action from U.S. Appl. No. 13/018,245, dated May 28, 2015.
Office Action from U.S. Appl. No. 13/028,863, dated Jun. 3, 2015.
Office Action from U.S. Appl. No. 13/758,763, dated Jun. 5, 2015.
Office Action from U.S. Appl. No. 14/185,123, dated Jun. 9, 2015.
Search Report and Office Action from Taiwanese Patent Appl. No. 099143827, dated Jun. 12, 2015.
Office Action from Taiwanese Patent Appl. No. 100107012, dated Jul. 22, 2015.
Decision of Board of Appeal and Minutes of Oral Proceedings from European Appl. No. 09152962, dated Jun. 2, 2015.
Decision to Grant from Chinese Patent Appl. No. 201080062056.X, dated Jul. 6, 2015.
Office Action from Taiwanese Appl. No. 101107038, dated Jul. 21, 2015.
Office Action from Taiwanese Patent Appl. No. 100107042, dated Jun. 2, 2015.
Office Action from Taiwanese Patent Appl. No. 100107047, dated Jun. 2, 2015.
Office Action from Taiwanese Patent Appl. No. 100107040, dated Jun. 2, 2015.
Office Action from Taiwanese Patent Appl. No. 100107044, dated Jun. 1, 2015.
Third Office Action from Chinese Patent Appl. No. 201180022606X, dated Jun. 10, 2015.
Third Office Action from Chinese Patent Appl. No. 2011800207092, dated Jul. 13, 2015.
Notice of Allowance from Japanese Patent Appl. No. 2014-122643, dated Sep. 3, 2015.
Notification of the Fourth Office Action from Chinese Patent Appl. No. 2011800207069, dated Aug. 24, 2015.
Decision of Rejection from Japanese Patent Appl. No. 2012-566065, dated Aug. 18, 2015.
Second Office Action from Chinese Patent Appl. No. 2011800226267, dated Aug. 3, 2015.
Office Action from U.S. Appl. No. 13/430,478, dated Aug. 27, 2015.
Office Action from U.S. Appl. No. 12/985,275, dated Sep. 2, 2015.
Office Action from U.S. Appl. No. 13/029,068, dated Sep. 8, 2015.
Office Action from U.S. Appl. No. 13/029,063, dated Sep. 17, 2015.
Office Action from U.S. Appl. No. 11/149,999, dated Oct. 1, 2015.
Third Office Action from Chinese Patent Appl. No. 2011800223856—translations only, original already submitted.
Official Notification and Search Report from Taiwanese Patent appl. No. 10421609300, dated Dec. 1, 2015.
Official Notification and Search Report from Taiwanese Patent appl. No. 10421621560, dated Dec. 2, 2015.
Third Office Action from Chinese Patent Appl. No. 2011800226248, dated Nov. 20, 2015.
Official Notification and Search Report from Taiwanese Patent appl. No. 10421651990, dated Dec. 7, 2015.
Notice of Issuance from Chinese Patent Appl. No. 2011800226063X, dated Dec. 10, 2015.
Official Notification and Search Report from Taiwanese Patent Appl. No. 10421595210, dated Nov. 27, 2015.
Office Action from Chinese Patent Appl. No. 201180022583.2, dated Dec. 17, 2015.
Examination from European Patent appl. No. 11 710 906.6-1757, dated Jan. 8, 2016.
Examination from European Patent appl. No. 11 710 348.1-1757, dated Jan. 8, 2016.
Office Action from U.S. Appl. No. 13/430,478; Jan. 7, 2016.
Office Action from U.S. Appl. No. 13/758,763; Feb. 2, 2016.
Office Action from U.S. Appl. No. 13/029,063; Feb. 11, 2016.
Fourth Office Action from Chinese Patent Appl. No. 201180020709.2, Dated Jan. 25, 2016.
Decision of Rejection from Chinese Patent Appl. No. 201180020706.9, dated Mar. 2, 2016.
Re-Examination Report from Japanese Patent Appl. No. 2012-556065, dated Feb. 1, 2016.
Examination Report from European Patent Appl. No. 11 709 509.1-1757, Dated Mar. 4, 2016.
Office Action from U.S. Appl. No. 12/985,275; Feb. 18, 2016.
Office Action from U.S. Appl. No. 14/453,482; Apr. 1, 2016.
Office Action from U.S. Appl. No. 13/536,707, dated Nov. 16, 2015.
Office Action from U.S. Appl. No. 14/185,123, dated Nov. 17, 2015.
Office Action from U.S. Appl. No. 13/029,068, dated Dec. 3, 2015.
Office Action from U.S. Appl. No. 14/453,482, dated Oct. 1, 2015.
Office Action from U.S. Appl. No. 14/108,815, dated Nov. 5, 2015.
Examination from European Patent Appl. No. 10799139.0, dated Nov. 18, 2015.
Request for Correction from Chinese Patent Appl. No. 201180022606X, dated Nov. 12, 2015.
Third Office Action from Chinsse Patent Appl. No. 2011800223856, dated Nov. 2, 2015.
Notice to Submit a Response from Korean Design Patent Application No. 30-2011-0024961, dated Sep. 10, 2012.
International Search Report and Written Opinion for PCT/US2011/000398 mailed Aug. 30, 2011.
International Search Report and Written Opinion for PCT/US2011/000406 mailed Sep. 15, 2011.
Third Office Action for Chinece Application No. 201180025832; dated Jul. 7, 2016.
Notice of Issuance for Chinese Application No. 201180020709.2; dated Jul. 25, 2016.
Office Action for U.S. Appl. No. 13/758,763; dated Jul. 26, 2016.
European Office Action for Application No. 11710348.1 dated Aug. 8, 2016.
Office Action for U.S. Appl. No. 12/985,275; dated Aug. 30, 2016.
Office Action for U.S. Appl. No. 13/029,063; dated Sep. 8, 2016.
Office Action for U.S. Appl. No. 14/108,815; dated Sep. 12, 2016.
Office Action for U.S. Appl. No. 14/453,482; dated Sep. 22, 2016.
Notice of Allowance for European Application No. 11710906.6; dated Sep. 2, 2016.

\* cited by examiner

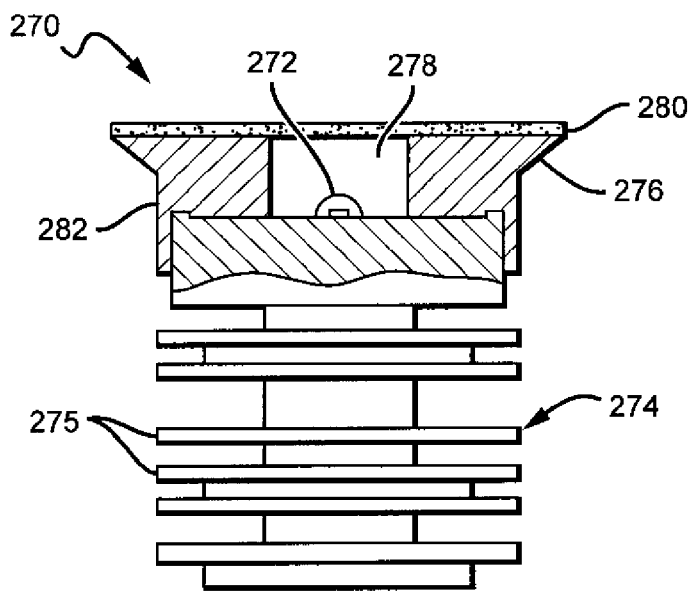
FIG. 14
FIG. 15
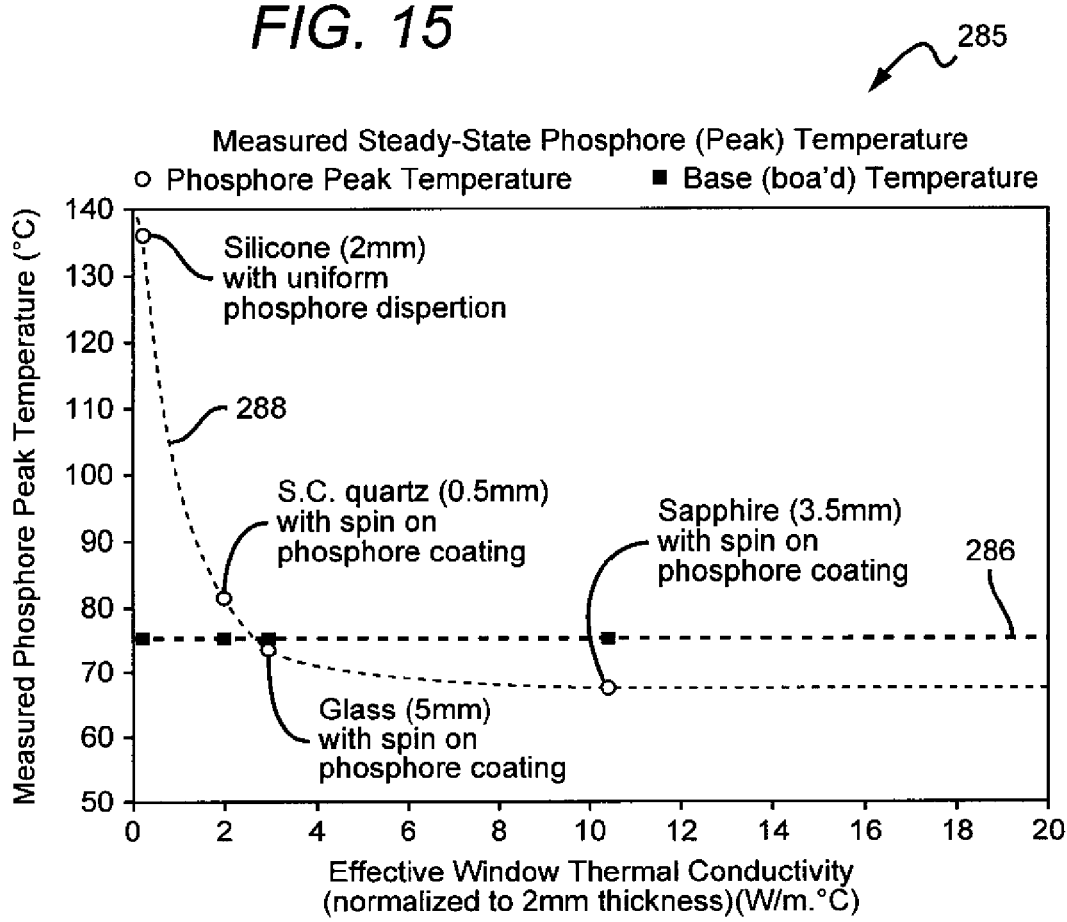

LED LAMP INCORPORATING REMOTE PHOSPHOR WITH HEAT DISSIPATION FEATURES

This application claims the benefit of U.S. Provisional Patent Application Ser. No. 61/339,516, filed on Mar. 3, 2010, U.S. Provisional Patent Application Ser. No. 61/339,515, filed on Mar. 3, 2010, U.S. Provisional Patent Application Ser. No. 61/386,437, filed on Sep. 24, 2010, U.S. Provisional Application Ser. No. 61/424,665, filed on Dec. 19, 2010, U.S. Provisional Application Ser. No. 61/424,670, filed on Dec. 19, 2010, U.S. Provisional Patent Application Ser. No. 61/434,355, filed on Jan. 19, 2011, U.S. Provisional Patent Application Ser. No. 61/435,326, filed on Jan. 23, 2011, U.S. Provisional Patent Application Ser. No. 61/435,759, filed on Jan. 24, 2011. This application is also a continuation-in-part from, and claims the benefit of, U.S. patent application Ser. No. 12/848,825, filed on Aug. 2, 2010 now U.S. Pat. No. 8,562,161.

This invention was made with Government support us Department of Energy Contract No. DE-FC26-08NT01577. The Government has certain rights in this invention.

BACKGROUND OF THE INVENTION

Field of the Invention

This invention relates to solid state lamps and bulbs and in particular to efficient and reliable light emitting diode (LED) based lamps and bulbs comprising remote phosphors with heat dissipation features.

Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflective cup due to the less than 100% reflectivity of practical reflector surfaces). In addition, heat retention may be an issue for a package such as the package 10 shown in FIG. 1, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 27 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LED chips, such as those found in the LED package 20 of FIG. 2 can be coated by conversion material comprising one or more phosphors, with the phosphors absorbing at least some of the LED light. The conversion material can emit a different wavelength of light such that LED package emits a combination of light from the LED chip and the phosphor. The LED chip(s) can be coated with a phosphor using many different methods, with one suitable method being described in U.S. patent application Ser. Nos. 11/656,759 and 11/899,790, both to Chitnis et al. and both entitled "Wafer Level Phosphor Coating Method and Devices Fabricated Utilizing Method". Alternatively, the LEDs can be coated using other methods such as electrophoretic deposition (EPD), with a suitable EPD method described in U.S. patent application Ser. No. 11/473,089 to Tarsa et al. entitled "Close Loop Electrophoretic Deposition of Semiconductor Devices".

These types of LED chips have been used in different lamps, but experience some limitations based on the structure of the devices. The phosphor material is on or in close proximity to the LED epitaxial layers and in some instances comprises a conformal coat over the LED. In these arrangements, the phosphor material is subjected to direct chip heating due to the lack of a heat dissipation path except through the chip itself. As a result the phosphor material can operate at a temperature higher than the LED chip. This elevated operating temperature can cause degradation of the phosphor material, the binding material, and/or the encapsulant material over time. It can also cause a reduction in phosphor conversion efficiency and consequently often a shift in the perceived color of the LED light.

Lamps have also been developed utilizing solid state light sources, such as LEDs, with a conversion material that is separated from or remote to the LEDs. Such arrangements are disclosed in U.S. Pat. No. 6,350,041 to Tarsa et al., entitled "High Output Radial Dispersing Lamp Using a Solid State Light Source." The lamps described in this patent can comprise a solid state light source that transmits light through a separator to a disperser having a phosphor. The disperser can disperse the light in a desired pattern and/or changes its color by converting at least some of the light through a phosphor. In some embodiments the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759 to Negley et al., entitled "Lighting Device."

Phosphors, however, generate heat during the light conversion process and this phosphor conversion heating can account for 20-30% of the total heat generation in an LED package. In applications where the phosphor is located in close proximity to the chip (e.g., conformally coated onto the chip), the high local density of excitation photons emerging from the chip surface can lead to very high local heating and hence high peak temperatures in the phosphor layer. In many remote phosphor applications, this photon density is spread out over a larger phosphor area, generally leading to reduced local temperatures. However, in many remote phosphor arrangements the heat from phosphor conversion heating generally has inadequate heat dissipation paths to dissipate the phosphor conversion heat. Without an effective heat dissipation pathway, thermally isolated remote phosphors may suffer from elevated operating temperatures that in some instances can be even higher than the temperature in comparable conformal coated layers. This can lead to degradation, conversion inefficiency and color shifting, some of which was meant to be avoided by having a remote phosphor.

SUMMARY OF THE INVENTION

The present invention provides various embodiments of lamps and bulbs that are efficient, reliable and cost effective. The different embodiments can be arranged with remote conversion material, which helps reduce or eliminate the spread of heat from the light emitters to the phosphor material. The lamps and bulbs can also comprise thermal management features that allow for efficient conduction of conversion generated heat away from the remote conversion material. This reduces or eliminates the negative impact that elevated temperature can have on efficiency and reliability of the conversion material. In different embodiments that conversion material can comprise a phosphor carrier that can be 2-dimensional shaped.

One embodiment of a lamp according to the present invention comprises a light source and a planar phosphor carrier remote to the light source. The phosphor carrier can comprise a thermally conductive material that is at least partially transparent to light from the light source, and a conversion material that absorbs light from the light source and emits a different wavelength of light. A heat sink structure is included with the phosphor carrier thermally coupled to the heat sink structure.

One embodiment of an LED based lamp according to the present invention comprises an LED light source and a planar phosphor arranged remote to the light source. Light emitted from the light source passes through the phosphor and at least some of light is converted by the phosphor. The lamp further comprises a thermally conductive path to conduct phosphor conversion heat away from the phosphor and to dissipate the heat.

Another embodiment of a lamp according to the present invention comprises a heat sink structure and an LED based light source. A conversion material is arranged remote to the light source and arranged to absorb light from the light source and re-emit light in different wavelengths. A first thermally conductive path conducts conversion generated heat away from the conversion material to the heat sink.

Still another embodiment of a lamp according to the present invention comprises a light source and an optical cavity comprising a phosphor carrier over an opening to the cavity. The light source is mounted in the optical cavity remote to the phosphor carrier with light from the light source passing through the phosphor carrier. The optical cavity further comprising reflective surfaces to reflect light from the light source and the phosphor carrier. A thermally conductive path conducts phosphor conversion heat away from the phosphor to dissipate the heat.

These and other aspects and advantages of the invention will become apparent from the following detailed description and the accompanying drawings which illustrate by way of example the features of the invention.

BRIEF DESCRIPTION OF THE DRAWINGS

FIG. 14 is a side view of another embodiment of a lamp according to the present invention; and FIG. 15 is a graph showing steady state operating temperatures for one embodiment of a lamp according to the present invention.

DETAILED DESCRIPTION OF THE INVENTION

Figure 1:
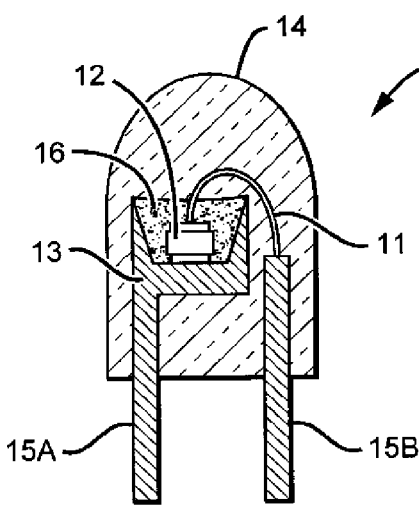
FIG. 1 shows a sectional view of one embodiment of a prior art LED lamp.
Figure 2:
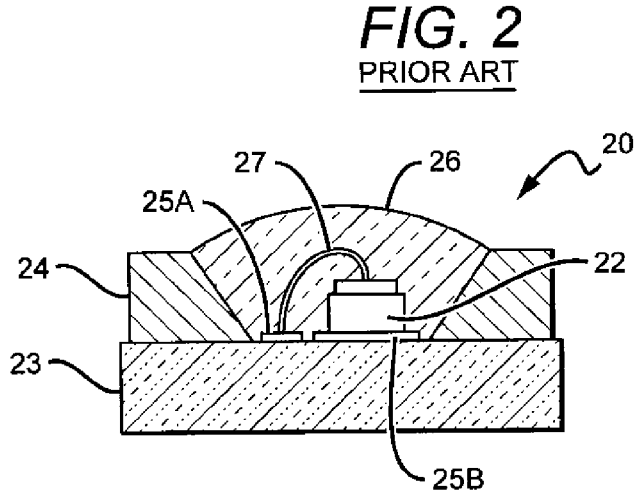
FIG. 2 shows a sectional view of another embodiment of a prior art LED lamp.

The present invention is directed to different embodiments of lamp or bulb structures comprising a remote conversion material that can be arranged so that less heat from the emitters heats the conversion material, with the remote conversion material also capable of being operated without the substantial build-up of heat in the conversion material due to the light conversion process. This reduces or eliminates the negative impact that elevated temperature can have on efficiency and reliability of the conversion material. The present invention is also directed to lamps comprising features that mask the conversion material from the view by the lamp user, and can also disperse or redistribute the light from the remote conversion material and/or the lamp's light source into a desired emission pattern.

Different embodiments of the lamps can have many different shapes and sizes and in different lamp embodiments the conversion material can comprise one or multiple conversion materials, such as phosphors. Thermal paths can be included for heat to dissipate from the conversion material during operation while at the same time keeping the conversion material remote to the light source so that most or all of the heat from the light source does not pass into the conversion material and the local density of excitation photons incident of the phosphor layer is reduced. This allows the remote conversion material to operate with a lower temperature and reduced photon excitation density compared to conversion materials lacking thermally conductive paths to dissipate conversion heat.

By being remote and remaining relatively cool, the conversion material can operate more efficiently and does not suffer the heat related color shift. Operating at lower temperature also reduces heat related degradation of the conversion material and can increase the long term reliability of the conversion material. The different remote arrangements according to the present invention can also allow the conversion material to operate with lower excitation density which can reduce the likelihood that the phosphor will be optically saturated by incident light from the light source.

In some lamp embodiments according to the present invention, the conversion material can comprise a phosphor carrier that includes one or more phosphors arranged on or integral to a carrier layer or material. The carrier layer can comprise many different thermally conductive materials that are substantially transparent to the desired wavelengths of light, such as the light emitted by the lamp's light emitters. In some embodiments the phosphor carrier can be provided with a means for dissipating the build-up of conversion heating and in one embodiment the phosphor carrier is in good thermal contact with a heat sink structure. The phosphor carrier can be mounted to the heat sink with thermal contact at the edges of the phosphor carrier. A light source can be mounted in the lamp, such as in or on the heat sink structure, at a location so that there is separation between the light source and the phosphor carrier; i.e. the phosphor carrier and its phosphor are remote from the light source.

The light source is also arranged so that at least some of its emitted light passes through the phosphor carrier and its phosphor, with at least some of the light from the light source converted by the phosphor. In some embodiments this conversion can comprise photon down conversion wherein the wavelength of the converted light is longer than the light source light. In other embodiments this conversion can comprise up conversion wherein the wavelength of the converted light is shorter than the light source light. In either case, the conversion can cause heat to be generated in the phosphor from the conversion process. The phosphor conversion heat can be conducted through the thermally conductive carrier layer and into the heat sink structure where it can dissipate into the ambient. In some embodiments, the carrier layer can collect the heat generated from the phosphor layer, spreads it laterally, and conducts the heat to the heat sink structure. The heat sink structure can be arranged with different features that help dissipate the heat to the ambient, and this thermal management arrangement allows the remote phosphor layer to maintain a lower operating temperature leading to the benefits mentioned above.

As further described below, the lamps according to the present invention can be arranged in many different ways. In some embodiments the light sources can comprise solid state light sources, such as different types of LEDs, LED chips or LED packages with different lens or optic arrangements. In other embodiments a single LED chip or package can be used, while in others multiple LED chips or packages can be used and arranged in different types of arrays. By having the phosphor thermally isolated or not in direct thermal contact from LED chips and with good thermal dissipation, the LED chips can be driven by higher current levels without causing detrimental effects to the conversion efficiency of the phosphor and its long term reliability. This can allow for the flexibility to overdrive the LED chips so that a lower number of LEDs can be used to produce the desired luminous flux, which in turn can reduce the cost and/or the complexity of the lamps. These LED packages can also comprise LEDs encapsulated with a material that can withstand the elevated luminous flux or can comprise unencapsulated LEDs.

In some embodiments the light source can comprise one or more blue emitting LEDs and the phosphor in the phosphor carrier can comprise one or more materials that absorb a portion of the blue light and emit one or more different wavelengths of light such that the lamp emits a white light combination from the blue LED and the conversion material. The conversion material can absorb the blue LED light and emit different colors of light including but not limited to yellow and green. The light source can also comprise different LEDs and conversion materials emitting different colors of light so that the lamp emits light with the desired characteristics such as color temperature and color rendering.

For some applications, it may be desirable (in order to meet specific requirements of color point/color temperature and/or color rendering) to have some portion of the light emitted by the light source and/or phosphor layer comprise essentially red light. Conventional lamps incorporating both red and blue LED chips can be subject to color instability with different operating temperatures and dimming. This can be due to the different behaviors of red and blue LEDs at different temperature and operating power (current/voltage), as well as different operating characteristics over time. This effect can be mitigated somewhat through the implementation of an active control system that can add cost and complexity to the overall lamp. Different embodiments according to the present invention can address this issue by having a light source with the same type of emitters in combination with a remote phosphor that can comprise multiple types or layers and/or regions of phosphors that remain relatively cool through the thermal dissipation arrangements disclosed herein. The remote phosphor carrier can absorb light from the emitters and can re-emit different colors of light, including red light, while still experiencing the efficiency and reliability of reduced operating temperature for the phosphors.

The separation of the phosphor elements from the LEDs provides the added advantage of easier and more consistent color binning. This can be achieved in a number of ways. LEDs from various bins (e.g. blue LEDs from various bins) can be assembled together to achieve substantially wavelength uniform excitation sources that can be used in different lamps. These can then be combined with phosphor carriers having substantially the same conversion characteristics to provide lamps emitting light within the desired bin. In addition, numerous phosphor carriers can be manufactured and pre-binned according to their different conversion characteristics. Different phosphor carriers can be combined with light sources emitting different characteristics to provide a lamp emitting light within a target color bin.

The heat sink structure can comprise different structures and materials in different embodiments according to the present invention. In some embodiments it can comprise a thermally conductive material having heat dissipating features such as fins or heat pipes. In still other embodiments the heat sink structure can comprise different types of lamp collars that can be mounted to a different feature such as a separate heat sink. Different phosphor carriers according to the present invention can be arranged in different ways, such as with phosphor layers arranged on different surfaces of a carrier layer, phosphor regions patterned on a surface(s) of a carrier layer, or phosphor regions either uniformly or non-uniformly distributed across or throughout the carrier layer. The phosphor carrier can also include other materials such as scattering particles, while in other embodiments the phosphor carrier can comprise more than one phosphor material.

The lamps according to the present invention can also provide for improved emission efficiency by surrounding the light source with a reflective surface. This can result in enhanced photon recycling by reflecting much of the light re-emitted from the conversion material back toward the light source. To further enhance efficiency and to provide the desired emission profile, the surfaces of the phosphor layer or carrier layer can be smooth or scattering. In some embodiments, the internal surfaces of the carrier layer can be optically smooth to promote total internal reflecting behavior that reduces the amount of light directed backward from the phosphor layer (either downconverted light or scattered light). Correspondingly, in some cases one or more external surfaces of the carrier layer or phosphor layer may be roughened or otherwise modified to promote light emission from this external surface. Further, the combination of one or more roughened external surfaces with smooth internal surfaces may be used to promote light emission through the carrier and phosphor layer in preferred directions. Properties such as surface roughness, reflectivity, and index of refraction of the carrier layer and phosphor layer may in general be used to guide or direct the light emitted by or transferred through the carrier/phosphor layer into preferred directions, for example to provide improved efficiency by reducing the amount of backward emitted light that can be absorbed by the lamp's LED chips, associated substrate, or other non-ideal reflecting surfaces within the interior of the lamp, improving beam intensity profiles and color uniformity, etc. The phosphor layer and/or carrier layer may comprise essentially two-dimensional geometries, such as a planar or disk-shaped profiles. The planar shapes can facilitate fabrication and application of the phosphor layer and reduce manufacturing costs.

The present invention is described herein with reference to certain embodiments, but it is understood that the invention can be embodied in many different forms and should not be construed as limited to the embodiments set forth herein. In particular, the present invention is described below in regards to certain lamps having LEDs or LED chips or LED packages in different configurations, but it is understood that the present invention can be used for many other lamps having many different array configurations. Examples of different lamps arranged in different ways according to the present invention are described below and in U.S. Provisional Patent application Ser. No. 61/435,759, to Le et al., entitled "Solid State Lamp", filed on Jan. 24, 2011, and incorporated herein by reference.

The embodiments below are described with reference to LED or LEDs, but it is understood that this is meant to encompass LED chips and LED packages. The components can have different shapes and sizes beyond those shown and different numbers of LEDs can be included. It is also understood that the embodiments described below can use co-planar light sources, but it is understood that non co-planar light sources can also be used.

The present invention is described herein with reference to conversion materials, phosphor layers and phosphor carriers, all being "remote" to said light source or LED. Remote in this context refers being spaced apart from and/or not being on or in direct thermal contact.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 3:
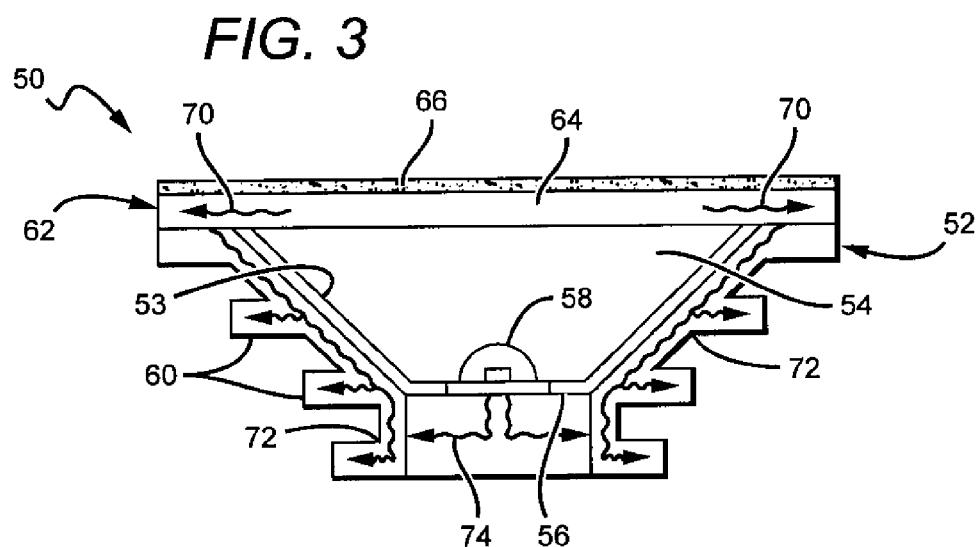
FIG. 3 is a sectional view of one embodiment of a lamp according to the present invention.

FIG. 3 shows one embodiment of a lamp 50 according to the present invention that comprises a heat sink structure 52 having an optical cavity 54 with a platform 56 for holding a light source 58. Although this embodiment and some embodiments below are described with reference to an optical cavity, it is understood that many other embodiments can be provided without optical cavities. The light source 58 can comprise many different emitters with the embodiment shown comprising an LED, which can comprise many different commercially available LED chips or LED packages including, but not limited to, those commercially available from Cree, Inc. located in Durham, N.C. The light source 58 can be mounted to the platform 56 using many different known mounting methods and materials with light from the light source 58 emitting out the top opening of the cavity 54. In some embodiments light source 58 can be mounted directly to the platform 56, while in other embodiments the light source can be included on a submount or printed circuit board (PCB) that is then mounted to the platform 56. The platform 56 and the heat sink structure 52 can comprise electrically conductive paths for applying an electrical signal to the light source 58, with some of the conductive paths being conductive traces or wires. All or portions of the platform 56 can also be made of a thermally conductive material and the thermally conductive material can be thermally coupled to or integral to the heat sink structure 52.

In some embodiments the lamp's light source can be provided as an array of emitters that are co-planar, with the emitters being mounted on a flat or planar surface. Co-planar light sources can reduce the complexity of the emitter arrangements, making them both easier and cheaper to manufacture. Co-planar light sources, however, tend to emit primarily in the forward direction such as in a Lambertian emission pattern.

The heat sink structure 52 can at least partially comprise a thermally conductive material, and many different thermally conductive materials can be used including different metals such as copper or aluminum, or metal alloys. In some embodiments the heat sink can comprise high purity aluminum that can have a thermal conductivity at room temperature of approximately 210 W/m-k). In other embodiments the heat sink structure can comprise die cast aluminum having a thermal conductivity of approximately 200 W/m-k. The heat sink structure 52 can also comprise other heat dissipation features such as heat fins 60 that increase the surface area of the heat sink to facilitate more efficient heat dissipation into the ambient. In some embodiments, the heat fins 60 can be made of material with higher thermal conductivity than the remainder of the heat sink. In the embodiment shown the fins 60 are shown in a generally horizontal orientation, but it is understood that in other embodiments the fins can have a vertical or angled orientation.

Reflective layers 53 can also be included on the heat sink structure 52, such as on the surface of the optical cavity 54. In some embodiments the surfaces can be coated with a material having a reflectivity of approximately 75% or more to the visible wavelengths of light emitted by the light source 58 and/or a wavelength conversion material ("the lamp light"), while in other embodiments the material can have a reflectivity of approximately 85% or more to the lamp light. In still other embodiments the material can have a reflectivity to the lamp light of approximately 95% or more.

The heat sink structure 52 can also comprise features for connecting to a source of electricity such as to different electrical receptacles. In some embodiments the heat sink structure can comprise a feature of the type to fit in conventional electrical receptacles. For example, it can include a feature for mounting to a standard Edison socket, which can comprise a screw-threaded portion which can be screwed into an Edison socket. In other embodiments, it can include a standard plug and the electrical receptacle can be a standard outlet, or can comprise a GU24 base unit, or it can be a clip and the electrical receptacle can be a receptacle which receives and retains the clip (e.g., as used in many fluorescent lights). These are only a few of the options for heat sink structures and receptacles, and other arrangements can also be used that safely deliver electricity from the receptacle to the lamp 50. The lamps according to the present invention can comprise a power conversion unit that can comprise a driver to allow the bulb to run from an AC line voltage/current and to provide light source dimming capabilities. In some embodiments, the power supply can comprise an offline constant-current LED driver using a non-isolated quasi-resonant flyback topology. The LED driver can fit within the lamp and in some embodiments can comprise a less than 25 cubic centimeter volume, while in other embodiments it can comprise an approximately 20 cubic centimeter volume. In some embodiments the power supply can be non-dimmable but is low cost. It is understood that the power supply used can have different topology or geometry and can be dimmable as well.

A phosphor carrier 62 is included over the top opening of the cavity 54 and in the embodiment shown it covers the entire opening. The cavity opening is shown as circular and the phosphor carrier 62 is a circular disk, but it is understood that the cavity opening and the phosphor carrier can be many different shapes and sizes. It is also understood that the phosphor carrier 62 can cover less than all of the cavity opening. Phosphor carriers according to the present invention can be characterized as comprising a conversion material and thermally conductive light transmitting material. The light transmitting material can be transparent to the light emitted from the light source 58 and the conversion material should be of the type that absorbs the wavelength of light from the light source and re-emits a different wavelength of light. In the embodiment shown, the thermally conductive light transmitting material comprises a carrier layer 64 and the conversion material comprises a phosphor layer 66 on the carrier layer 64. As further described below, different embodiments can comprise many different arrangements of a carrier layer and phosphor layer.

When light from the light source 58 is absorbed by the phosphor in the phosphor layer 66 it is re-emitted in isotropic directions with approximately 50% of the light emitting forward and 50% emitting backward into the cavity 54. In prior LEDs having conformal phosphor layers, a significant portion of the light emitted backwards can be directed back into the LED and its likelihood of escaping is limited by the extraction efficiency of the LED structure. For some LEDs the extraction efficiency can be approximately 70%, so a percentage of the light directed from the conversion material back into the LED can be lost. In lamps according to the present invention having a remote phosphor configuration, with LEDs on the platform 56 at the bottom of the cavity 54, a higher percentage of the backward emitted phosphor light strikes a surface of the cavity instead of the LED. Coating these surfaces with reflective layer 53 increases the percentage of light that reflects back into the phosphor layer 66 where it can emit from the lamp. These reflective layers 53 allow for the optical cavity to effectively recycle photons, and increase the emission efficiency of the lamp. It is understood that the reflective layer can comprise many different materials and structures including but not limited to reflective metals or multiple layer reflective structures such as distributed Bragg reflectors. Reflective layers can also be included in embodiments not having an optical cavity. In embodiments having LEDs mounted on a planar surface or on a pedestal, reflective layers can also be included around the LEDs to increase efficiency in much the same way as the reflective layers in the embodiments with optical cavities.

The carrier layer 64 can be made of many different materials having a thermal conductivity of 0.5 W/m-k or more, such as quartz, silicon carbide (SiC) (thermal conductivity ~120 W/m-k), glass (thermal conductivity of 1.0-1.4 W/m-k) or sapphire (thermal conductivity of ~40 W/m-k). The phosphor carrier can also have different thicknesses depending on the material being used, with a suitable range of thicknesses being 0.1 mm to 10 mm or more. It is understood that other thicknesses can also be used depending on the characteristics of the material for the carrier layer. The material should be thick enough to provide sufficient lateral heat spreading for the particular operating conditions. Generally, the higher the thermal conductivity of the material, the thinner the material can be while still providing the necessary thermal dissipation. Different factors can impact which carrier layer material is used including but not limited to cost and transparency to the light source light. Some materials may also be more suitable for larger diameters, such as glass or quartz. These can provide reduced manufacturing costs by formation of the phosphor layer on the larger diameter carrier layers and then singulation into the smaller carrier layers.

Many different phosphors can be used in the phosphor layer 66 with the present invention being particularly adapted to lamps emitting white light. As described above, in some embodiments the light source 58 can be LED based and can emit light in the blue wavelength spectrum. The phosphor layer can absorb some of the blue light and re-emit yellow. This allows the lamp to emit a white light combination of blue and yellow light. In some embodiments, the blue LED light can be converted by a yellow conversion material using a commercially available YAG:Ce phosphor, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for creating white light when used with a blue emitting LED based emitter include but not limited to:

$Tb_{3-x}RE_xO_{12}$:Ce(TAG); RE=Y, Gd, La, Lu; or
$Sr_{2-x-y}Ba_xCa_ySiO_4$:Eu.

The phosphor layer can also be arranged with more than one phosphor either mixed in the phosphor layer 66 or as a separate phosphor layer/regions either vertically or laterally on the carrier layer 64. In some embodiments, each of the two phosphors can absorb the LED light and can re-emit different colors of light. In these embodiments, the colors from the two phosphor layers can be combined for higher CRI white of different white hue (warm white). This can include light from yellow phosphors above that can be combined with light from red phosphors. Different red phosphors can be used including:

$Sr_xCa_{1-x}$S:Eu, Y; Y=halide;
$CaSiAlN_3$:Eu; or
$Sr_{2-y}Ca_ySiO_4$:Eu

Other phosphors can be used to create color emission by converting substantially all light to a particular color. For example, the following phosphors can be used to generate green light:

$SrGa_2S_4$:Eu;
$Sr_{2-y}Ba_ySiO_4$:Eu; or
$SrSi_2O_2N_2$:Eu.

The following lists some additional suitable phosphors used as conversion particles phosphor layer 66, although others can be used. Each exhibits excitation in the blue and/or UV emission spectrum, provides a desirable peak emission, has efficient light conversion, and has acceptable Stokes shift:

Yellow/Green
(Sr,Ca,Ba) $(Al,Ga)_2S_4$:$Eu^{2+}$
$Ba_2(Mg,Zn)Si_2O_7$:$Eu^{2+}$
$Gd_{0.46}Sr_{0.31}Al_{1.23}O_xF_{1.38}$: $Eu^{2+}_{0.06}$
$(Ba_{1-x-y}Sr_xCa_y) SiO_4$:Eu
$Ba_2SiO_4$:$Eu^{2+}$
Red
$Lu_2O_3$:$Eu^{3+}$
$(Sr_{2-x}La_x) (Ce_{1-x}Eu_x)O_4$
$Sr_2Ce_{1-x}Eu_xO_4$
$Sr_{2-x}Eu_xCeO_4$
$SrTiO_3$:$Pr^{3+}$, $Ga^{3+}$
$CaAlSiN_3$: $Eu^{2+}$
$Sr_2Si_5N_8$:$Eu^{2+}$ Different sized phosphor particles can be used including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light. In some embodiments, the phosphor can be provided in the phosphor layer 66 in a binder, and the phosphor can also have different concentrations or loading of phosphor materials in the binder. A typical concentration being in a range of 30-70% by weight. In one embodiment, the phosphor concentration is approximately 65% by weight, and is preferably uniformly dispersed throughout the remote phosphor. The phosphor layer 66 can also have different regions with different conversion materials and different concentrations of conversion material.

Different materials can be used for the binder, with materials preferably being robust after curing and substantially transparent in the visible wavelength spectrum. Suitable materials include silicones, epoxies, glass, inorganic glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing.

Phosphor layer 66 can be applied using different processes including but not limited to spray coating, spin coating, sputtering, printing, powder coating, electrophoretic deposition (EPD), electrostatic deposition, among others. As mentioned above, the phosphor layer 66 can be applied along with a binder material, but it is understood that a binder is not required. In still other embodiments, the phosphor layer 66 can be separately fabricated and then mounted to the carrier layer 64.

In one embodiment, a phosphor-binder mixture can be sprayed or dispersed over the carrier layer 64 with the binder then being cured to form the phosphor layer 66. In some of these embodiments the phosphor-binder mixture can be sprayed or dispersed on a heated carrier layer 64 so that when the phosphor binder mixture contacts the carrier layer 64, heat from the carrier layer 64 spreads into and cures the binder. These processes can also include a solvent in the phosphor-binder mixture that can liquefy and lower the viscosity of the mixture making it more compatible with spraying. Many different solvents can be used including but not limited to toluene, benzene, zylene, or OS-20 commercially available from Dow Corning®, and different concentration of the solvent can be used. When the solvent-phosphor-binder mixture is sprayed or dispersed on the heated carrier layer 64 the heat from the carrier layer 64 evaporates the solvent, with the temperature of the carrier layer impacting how quickly the solvent is evaporated. The heat from the carrier layer 64 can also cure the binder in the mixture leaving a fixed phosphor layer on the carrier layer. The carrier layer 64 can be heated to many different temperatures depending on the materials being used and the desired solvent evaporation and binder curing speed. A suitable range of temperature is 90 to 150° C., but it is understood that other temperatures can also be used. Various deposition methods and systems are described in U.S. Patent Application Publication No. 2010/0155763, to Donofrio et al., titled "Systems and Methods for Application of Optical Materials to Optical Elements," and also assigned to Cree, Inc. and incorporated herein in its entirety.

The phosphor layer 66 can have many different thicknesses depending on the concentration of phosphor material and the desired amount of light to be converted by the phosphor layer 66. Phosphor layers according to the present invention can be applied with concentration levels (phosphor loading) above 30%. Other embodiments can have concentration levels above 50%, while in still others the concentration level can be above 60%. In some embodiments the phosphor layer can have thicknesses in the range of 10-100 microns, while in other embodiments it can have thicknesses in the range of 40-50 microns.

The methods described above can be used to apply multiple layers of the same of different phosphor materials and different phosphor materials can be applied in different areas/regions of the carrier layer using known masking and/or printing processes. The methods described above provide some thickness control for the phosphor layer 66, but for even greater thickness control, the phosphor layer can be grinded using known methods to reduce the thickness of the phosphor layer 66 or to even out the thickness over the entire layer. This grinding feature provides the added advantage of being able to produce lamps emitting within a single bin on the CIE chromaticity graph. Binning is generally known in the art and is intended to ensure that the LEDs or lamps provided to the end customer emit light within an acceptable color range. The LEDs or lamps can be tested and sorted by color or brightness into different bins, generally referred to in the art as binning. Each bin typically contains LEDs or lamps from one color and brightness group and is typically identified by a bin code. White emitting LEDs or lamps can be sorted by chromaticity (color) and luminous flux (brightness). The thickness control of the phosphor layer provides greater control in producing lamps that emit light within a target bin by controlling the amount of light source light converted by the phosphor layer. Multiple phosphor carriers 62 with the same thickness of phosphor layer 66 can be provided. By using a light source 58 with substantially the same emission characteristics, lamps can be manufactured having nearly a color point that in some instances can fall within a single color bin. In some embodiments, the lamp emissions fall within a standard deviation from a point on a CIE diagram, and in some embodiments the standard deviation comprises less than a 10-step McAdams ellipse. In some embodiments the emission of the lamps falls within a 4-step McAdams ellipse centered at CIExy (0.313, 0.323).

The phosphor carrier 62 can be mounted and bonded over the opening in the cavity 54 using different known methods or materials such as thermally conductive bonding materials or a thermal grease. Conventional thermally conductive grease can contain ceramic materials such as beryllium oxide and aluminum nitride or metal particles such colloidal silver. In other embodiments the phosphor carrier can be mounted over the opening using thermal conductive devices such as clamping mechanisms, screws, or thermal adhesive hold phosphor carrier 62 tightly to the heat sink structure to maximize thermal conductivity. In one embodiment a thermal grease layer is used having a thickness of approximately 100 μm and thermal conductivity of k=0.5 W/m-k. This arrangement provides an efficient thermally conductive path for dissipating heat from the phosphor layer 66. During operation of the lamp 50, phosphor conversion heating is concentrated in the phosphor layer 66 such as in the center of the phosphor layer 66 where the majority of LED light strikes and passes through the phosphor carrier 62. The thermally conductive properties of the carrier layer 64 spreads this heat laterally toward the edges of the phosphor carrier 62 as shown by first heat flow 70. There the heat passes through the thermal grease layer and into the heat sink structure 52 as shown by second heat flow 72 where it can efficiently dissipate into the ambient.

As discussed above, in the lamp 50 the platform 56 and the heat sink structure 52 are thermally connected or coupled. This coupled arrangement results in the phosphor carrier 62 and that light source 58 at least partially sharing a thermally conductive path for dissipating heat. Heat passing through the platform 56 from the light source 58 as shown by third heat flow 74 can also spread to the heat sink structure 52. Heat from the phosphor carrier 62 flowing into the heat sink structure 52 can also flow into the platform 56. As further described below, in other embodiments, the phosphor carrier 62 and the light source can have separate thermally conductive paths for dissipating heat, with these separate paths being referred to as "decoupled".

Figure 4:
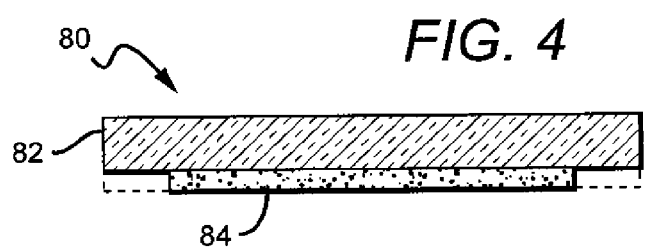
FIG. 4 is a sectional view of another embodiment of a phosphor carrier according to the present invention.

It is understood that the phosphor carriers can be arranged in many different ways beyond the embodiment shown in FIG. 3. Some of these different embodiments are shown in FIGS. 4 through 10, but it is understood that many more arrangements are possible in other embodiments. FIG. 4 shows another embodiment of a phosphor carrier 80 according to the present invention comprising a carrier layer 82 and a phosphor layer 84 that can be made of the same materials described above and can be formed using the same processes. In this embodiment, the phosphor layer 84 is on the bottom surface of the carrier layer 82 so that light from the LED light source passes through the phosphor layer 84 first. Converted light and LED light leaking through the phosphor layer 84 then passes through the carrier layer 82. In this arrangement the carrier layer 82 should be transparent to the light from both the phosphor layer 84 and LED light source. The phosphor layer 84 in this embodiment need not cover the entire bottom surface of the carrier layer 82. Instead, the edge of the carrier layer 82 can be uncovered by the phosphor layer 84 to allow good thermal contact with the heat sink. In some embodiments, however, the phosphor layer 84 can cover the entire bottom surface of the carrier layer 82.

Figure 5:
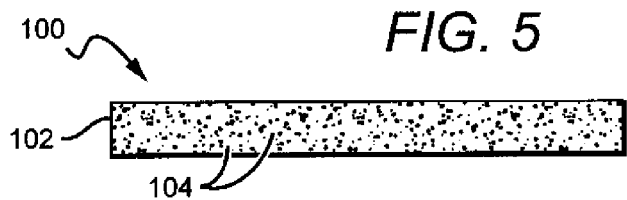
FIG. 5 is a sectional view of another embodiment of a phosphor carrier according to the present invention.

FIG. 5 shows still another embodiment of a phosphor carrier 100 according to the present invention which instead of comprising separate phosphor and carrier layers, comprises a carrier layer 102 with a phosphor 104 dispersed throughout. Just as with the previous embodiments, as heat is generated by the phosphor during conversion, the heat is spread laterally through the carrier layer 102 where it can dissipate in the heat sink. In this embodiment, the phosphor 104 is dispersed in the carrier layer in a nearly uniform concentration, but it is understood that in other embodiments, the phosphor 104 can have different concentrations in different regions of the carrier layer 102. It is also understood that more than one phosphor can be included in the carrier layer, either uniformly dispersed or dispersed in regions of different concentrations.

Figure 6:
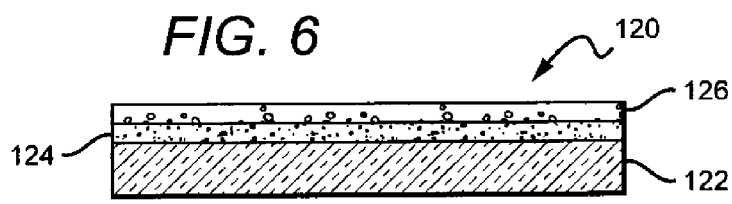
FIG. 6 is a sectional view of another embodiment of a phosphor carrier according to the present invention.

FIG. 6 shows another embodiment of phosphor carrier 120 according to the present invention also comprising a carrier layer 122 and phosphor layer 124 similar to those same elements described above and shown in FIG. 3. In this embodiment, a scattering particle layer 126 can be included on the carrier layer 122 and is shown on the phosphor layer 124. It is understood that it can be in many different locations on or in the carrier layer. The scattering particle layer is included to disperse the light as it emits from the phosphor carrier layer 120 to give it the desired emission pattern. In this embodiment, the scattering particles are arranged to disperse the light in generally uniform pattern.

In some embodiments the scattering particles layer can be deposited using the methods described above with reference to deposition of the phosphor layer and can comprise a dense packing of particles. The scattering particles can also be included in a binder material that can be the same as those described above in reference to the binder used with the phosphor layer. The scattering particle layer can have different concentrations of scattering particles depending on the application and materials used. A suitable range for scattering particle concentration is from 0.01% to 0.2%, but it is understood that the concentration can be higher or lower. In some embodiments the concentration can be as low as 0.001%. It is also understood that the scattering particle layer 126 can have different concentrations of scattering particles in different regions. For some scattering particles there can be an increase in loss due to absorption for higher concentrations. Thus, the concentrations of the scattering particles can be chosen in order to maintain an acceptable loss figure, while at the same time dispersing the light to provide the desired emission pattern.

The scattering particles can comprise many different materials including but not limited to:
 silica gel;
 zinc oxide (ZnO);
 yttrium oxide ($Y_2O_3$);
 titanium dioxide ($TiO_2$);
 barium sulfate ($BaSO_4$);
 alumina ($Al_2O_3$);
 fused silica ($SiO_2$);
 fumed silica ($SiO_2$);
 aluminum nitride;
 glass beads;
 zirconium dioxide ($ZrO_2$);
 silicon carbide (SiC);
 tantalum oxide ($TaO_5$);
 silicon nitride ($Si_3N_4$);
 niobium oxide ($Nb_2O_5$);
 boron nitride (BN); or
 phosphor particles (e.g., YAG:Ce, BOSE)
More than one scattering material in various combinations of materials or combinations of different forms of the same material may be used to achieve a particular scattering effect. It is understood that in other embodiments the scattering particle can be included in the carrier layer 122, the phosphor layer 124, or both.

Figure 7:
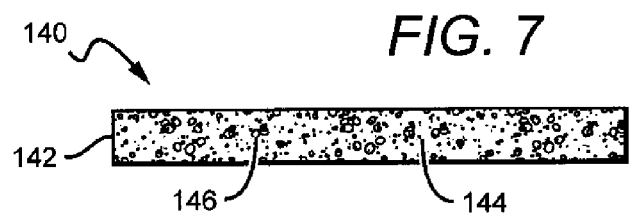
FIG. 7 is a sectional view of another embodiment of a phosphor carrier according to the present invention.

FIG. 7 shows another embodiment of a phosphor carrier 140 according to the present invention having a carrier layer 142 and phosphor 144 similar to the same elements described above and shown in FIG. 5. In this embodiment, scattering particles 146 are dispersed in the carrier layer 142 to disperse both the LED light and phosphor light passing through the carrier layer 142. The same scattering particles can be used as those described above and they can be included in different concentration in different embodiments. Other embodiments can comprise regions of different concentration so that light passing through the carrier layer is scattered to the desired emission pattern.

Figure 8:
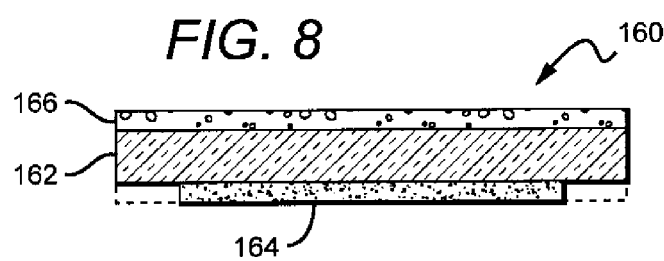
FIG. 8 is a sectional view of another embodiment of a phosphor carrier according to the present invention.

FIG. 8 shows another embodiment of a phosphor carrier 160 according to the present invention comprising a carrier layer 162 with a phosphor layer 164 on its bottom surface, with both arranged similarly to the same element described above and shown in FIG. 4. In this embodiment a scattering particle layer 166 is included on the top surface of the carrier layer 162 and can have the same materials deposited in the same way as scattering particle layer 126 in FIG. 6. In some embodiments the scatting particles in the scattering particle layer 166 can be arranged to scatter both the light from the phosphor layer 164 as well as the LED light leaking through the phosphor layer 164. In still other embodiments, the scattering particles can be arranged to scatter only one of these. It is understood that the scattering particles can also be dispersed in the carrier layer 162 or the phosphor layer 164, or both.

Figure 9:
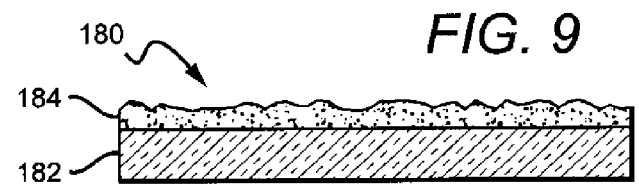
FIG. 9 is a sectional view of another embodiment of a phosphor carrier according to the present invention.

Other embodiments of the phosphor carrier can also comprise features to enhance light extraction from the lamp. Certain amount of light may strike the surface of the carrier layer or phosphor layer outside the angle of escape, such that the light will be reflected back toward the cavity of the heat sink structure. Some of this light can be absorbed, while other portions of the light may experience total internal reflection (TIR). FIG. 9 shows one embodiment of a phosphor carrier 180 having features arranged to reduce these losses. Like the embodiments above, the phosphor carrier comprises a carrier layer 182 and a phosphor layer 184. In this embodiment, the surface of the phosphor layer is roughened or shaped to provide varying surface angles. This can increase the likelihood that light will strike the surface within its escape angle so that it can contribute to useful emission. The surface can be shaped using known roughing or etching processes. The phosphor carrier layer 180 can also be arranged with scattering particles in different locations to disperse light as described above.

Figure 10:
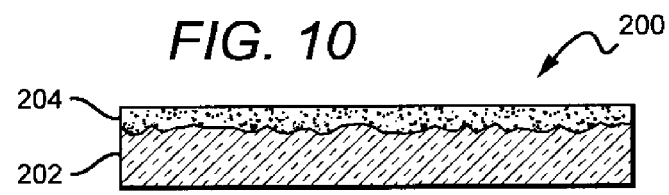
FIG. 10 is a sectional view of still another embodiment of a phosphor carrier according to the present invention.

The shaping or roughening can be included on different surfaces of phosphor carriers according to the present invention. FIG. 10 shows another embodiment of a phosphor carrier 200 according to the present invention comprising a carrier layer 202 and a phosphor layer 204. In this embodiment, the shaped/roughened layer is provided on the top surface of the carrier layer 202, with the phosphor layer provided on the roughened surface. The shape/roughened surface provides a varying surface that increases the likelihood that light will escape through the phosphor carrier 200. The roughened surface can be included on other surfaces of the carrier layer 202, and the phosphor carrier 200 can also be arranged with scattering particles as described above. It is further understood that the roughened surface can be included on any of the surfaces of the different phosphor carrier layer embodiments described above.

The lamps according to the present invention can comprise many different features beyond those described above. Referring again to FIG. 3, in some embodiments the cavity 54 can be filled with a transparent heat conductive material to further enhance heat dissipation for the lamp. The cavity conductive material could provide a secondary path for dissipating heat from the light source 58. Heat from the light source would still conduct through the platform 56, but could also pass through the cavity material to the heat sink structure 52. This would allow for lower operating temperature for the light source 58, but presents the danger of elevated operating temperature for the phosphor carrier 62. This arrangement can be used in many different embodiments, but is particularly applicable to lamps having higher light source operating temperatures compared to that of the phosphor carrier. This arrangement allows for the heat to be more efficiently spread from the light source in applications where additional heating of the phosphor carrier layer can be tolerated.

Figure 11:
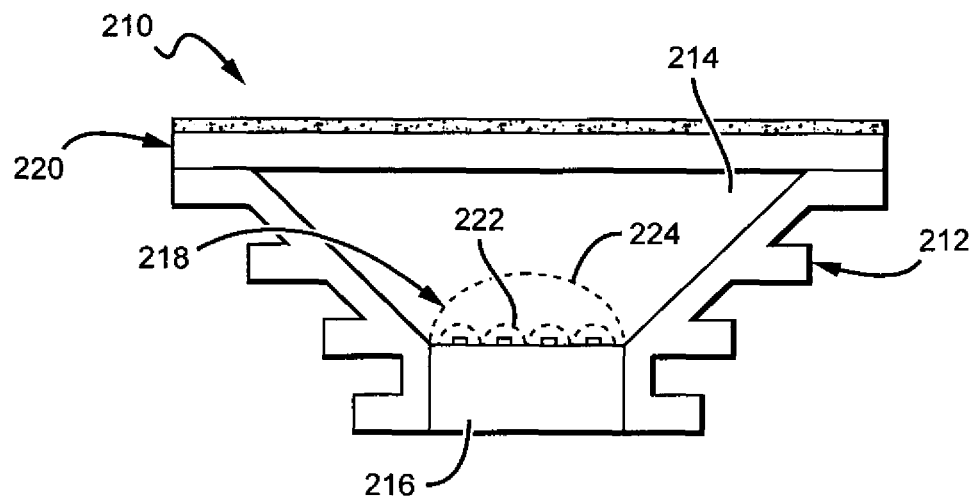
FIG. 11 is a sectional view of another embodiment of a lamp according to the present invention.

As discussed above, different lamp embodiments according to the present invention can be arranged with many different types of light sources. FIG. 11 shows another embodiment of a lamp 210 similar to the lamp 50 described above and shown in FIG. 3. The lamp 210 comprises a heat sink structure 212 having a cavity 214 with a platform 216 arranged to hold a light source 218. A phosphor carrier 220 can be included over and at least partially covering the opening to the cavity 214. In this embodiment, the light source 218 can comprise a plurality of LEDs arranged in separate LED packages or arranged in an array in a single multiple LED package. In each embodiment, the emitters can be coupled on different series and parallel arrangement. In one embodiment eight LEDs can be used that are connected in series with two wires to a circuit board. The wires can then be connected to the power supply unit described above. In other embodiments, more or less than eight LEDs can be used and as mentioned above, commercially available LEDs from Cree, Inc. can used including eight XLamp® XP-E LEDs or four XLamp® XP-G LEDs. Different single string LED circuits are described in U.S. patent application Ser. No. 12/566,195, to van de Ven et al., entitled "Color Control of Single String Light Emitting Devices Having Single String Color Control, and U.S. patent application Ser. No. 12/704,730 to van de Ven et al., entitled "Solid State Lighting Apparatus with Compensation Bypass Circuits and Methods of Operation Thereof", both of with are incorporated herein by reference.

For the embodiments comprising separate LED packages, each of the LEDs can comprise its own LED primary optics or lens 222. In embodiments having a single multiple LED package, a single primary optics or lens 224 can cover all the LEDs. It is understood that the LEDs can be provided without lenses and that in the array embodiments each of the LEDs can have its own lens. Likewise, unpackaged LEDs can be provided in a "chip on heat sink" or "chip on board" configuration. It is also understood that each can be provided with secondary optics arranged in different ways. Like the lamp 50, the heat sink structure and platform can be arranged with the necessary electrical traces or wires to provide an electrical signal to the light source 218.

Figure 12:
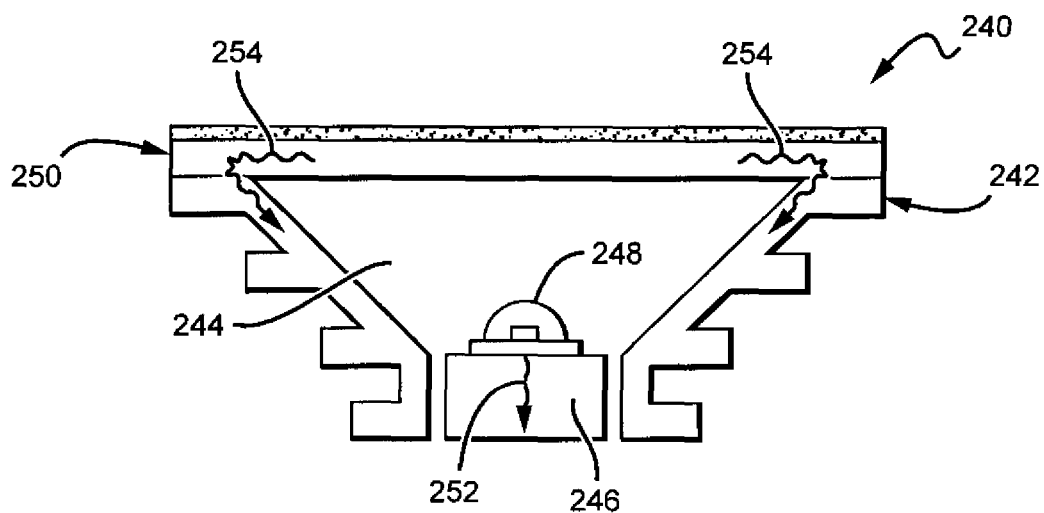
FIG. 12 is a sectional view of another embodiment of a lamp according to the present invention.

In the lamps 50 and 210 described above, the light source and the phosphor carrier share a thermal path for dissipating heat, referred to as being thermally coupled. In some embodiments the heat dissipation of the phosphor carrier may be enhanced if the thermal paths for the phosphor carrier and the light source are not thermally connected, referred to as thermally decoupled. FIG. 12 shows another embodiment of a lamp 240 according to the present invention also comprising a heat sink structure 242 with a cavity 244 with a platform 246 for mounting a light source 248. A phosphor carrier 250 is mounted by a thermally conductive material over and at least partially covering the opening to the cavity 244 so that at least some of the light from the light source passes through the phosphor carrier 250. In this embodiment the heat sink structure 242 and platform 246 have separate thermal dissipation paths that are substantially thermally isolated from one another (although convection may cause some thermal coupling between the two). The heat from the light source 248 conducts along fourth heat flow 252 and through the platform 246 where it can dissipate into the ambient or another heat sink structure (not shown), such as the connection of the lamp. Heat from the phosphor carrier 250 conducts along fifth heat flow 254 and into the heat sink structure 242 where it dissipates into the ambient. The thermal separation between the heat sink structure 242 and the platform 246 can be provided by physical separation of the two or by providing a thermally resistant material between the two such as through known thermal insulators (e.g. dielectrics).

Figure 13:
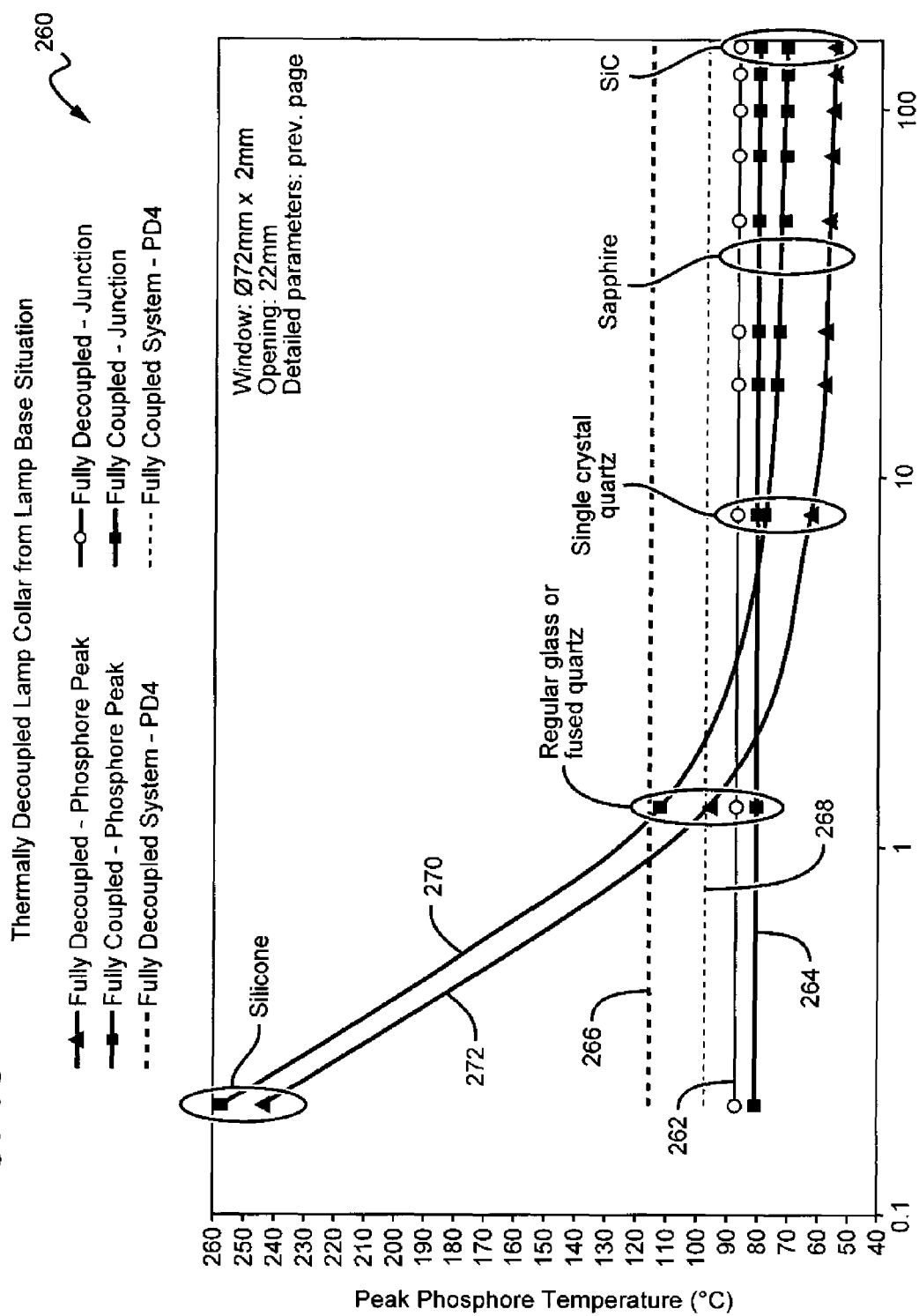
FIG. 13 is a graph showing operating temperatures for different emitters and features of the lamps according to the present invention.

FIG. 13 is a graph 260 showing the peak operating temperatures for conformal phosphor material compared to the operating temperature of remote phosphor carriers having carrier layers with different thermal conductivity and arranged so that heat can dissipate through thermal paths as described above. The graph 260 further compares the thermal performance of these different arrangements for thermally coupled and thermally decoupled heat sinks. First solid line 262 shows the junction temperature of the emitters having a heat sink that is thermally decoupled as described above, and second solid line 264 shows the junction temperature of the emitters for a thermally coupled heat sink. The operating temperature for the coupled arrangement is slightly lower than that of the decoupled arrangement. First dashed line 266 shows the peak phosphor temperature for a lamp having LEDs with a conformal phosphor coating and a thermally decoupled heat sink. Second dashed line 268 shows the peak phosphor temperature for the same lamp with a thermally coupled heat sink. In the conformal coating arrangement, the phosphor operates a generally consistent peak phosphor temperature and the thermally coupled lamp operates at a lower peak phosphor temperature compared to the decoupled arrangement.

By comparison, the third solid line 270 shows the peak phosphor temperature for a remote phosphor carrier arranged on a thermally coupled heat sink, with the temperature measured for carrier layers of different thermal conductivities in the range of 0.2 to more that 100 w/m-K. Fourth solid line 272 shows the same remote phosphor carrier and same range of thermal conductivities, with the phosphor carrier on a thermally decoupled heat sink. The remote phosphor carriers having carrier layers with thermal conductivity of above 1.05 W/m-k and arranged on a thermally decoupled heat sink can operate with lower phosphor temperature, thus higher conversion efficiency than conformal phosphor coated LEDs. This allows for the use of material such as regular glass, fused quartz, sapphire and silicon carbide. Thermally coupled heat sinks can be used but require a somewhat higher thermal conductivity and operates at a higher temperature compared to the thermally coupled arrangements.

FIG. 14 shows another embodiment of lamp 270 according to the present invention arranged in a different way to provide the desired remote phosphor and thermal characteristics for the phosphor carrier. The lamp 270 comprises a light source 272 mounted on the top surface of heat sink structure 274. The heat sink structure can be made of a heat conductive material as described above, and comprise heat dissipating structures such as fins 275. During operation, heat spreads from the light source 272 into the heat sink structure 274 where it spreads into the fins 275 and the ambient.

The lamp 270 also comprises a lamp collar 276 having a collar cavity 278, mounted on the top surface of the heat sink structure 274. The collar cavity 278 extends through the lamp collar such that it is open at the bottom and top. When the lamp collar 276 is mounted to the heat sink structure 274, the light source 272 is arranged so that it emits light out the top opening of the collar cavity 278. In this embodiment, the light source 272 is also arranged so that it is within the collar cavity 278.

A phosphor carrier 280 is mounted over the top opening of the collar cavity 278 with a thermally conductive material or device as described above. It is arranged so that light from the light source 272 passes through the phosphor carrier 280, where at least some of it is converted. The phosphor carrier 280 can be arranged with the structures and features described in the different embodiments described above, including but not limited to a carrier layer, phosphor, scattering particles, and/or roughening/shaping. The lamp collar 276 is also made of a heat conductive material so that heat from the phosphor carrier 280 spreads into the lamp collar 276. The heat from the lamp collar 276 can dissipate directly into the ambient or can spread into the heat sink structure 274 where it can spread into the ambient. The heat path for the phosphor carrier and the light source is coupled such that heat from phosphor carrier heat from the lamp collar 276 can spread into the heat sink structure 274, and light source heat can spread from the heat sink structure 274 to the lamp collar 276. The lamp collar 276 also has a skirt 282 that fits closely around the top portion of the heat sink structure 274 to allow for efficient conduction between the lamp collar 276 and heat sink structure 274.

FIG. 15 is a graph 285 showing the operating characteristics for different remote phosphors carriers used in the lamp 270. The first dashed line 286 shows the base or board temperature for the lamp, which remains constant at approximately 74.7° C. for a decoupled heat sink. Second dashed line 288 shows the peak temperature for the phosphor in different embodiments of remote phosphor carriers according to the present invention. For 5 mm thick glass with a spin on phosphor layer and for 0.5 mm thick sapphire with a spin on phosphor layer, the peak phosphor operating temperature is below that of the base. Like above, this allows for greater emission efficiency and less heat related degradation of the phosphor.

Although the present invention has been described in detail with reference to certain preferred configurations thereof, other versions are possible. Therefore, the spirit and scope of the invention should not be limited to the versions described above.

We claim:

1. A lamp, comprising:
  a light source;
  a planar phosphor carrier remote to said light source and comprising a thermally conductive material at least partially transparent to light from said light source, and a conversion material that absorbs light from said light source and emits different wavelengths of light; and
  a heat sink structure which forms walls of an optical cavity and comprising fins which extend from said walls of said optical cavity in a direction parallel to said planar phosphor carrier, said phosphor carrier thermally coupled to said heat sink structure, said light source mounted within said optical cavity;
  wherein said phosphor carrier comprises a carrier layer and a phosphor layer, said carrier layer comprising a first surface adjacent said phosphor layer and a second surface opposite said phosphor layer;
  wherein a portion of said first surface is uncovered by said phosphor layer, said uncovered portion of said first surface contacting said heat sink such that said first surface of said carrier layer and said phosphor layer are adjacent to said heat sink and said second surface of said carrier layer is opposite said heat sink.

2. The lamp of claim 1, wherein said phosphor carrier comprises scattering particles.

3. The lamp of claim 1, wherein said phosphor carrier comprises a separate layer containing scattering particles.

4. The lamp of claim 1, wherein said phosphor carrier comprises a surface that is roughened.

5. The lamp of claim 1, wherein heat from said phosphor carrier conducts into said heat sink structure through said thermal coupling.

6. The lamp of claim 1, wherein said light source comprises an LED based light source.

7. The lamp of claim 1, wherein said light source comprises a blue emitting LED and said phosphor carrier comprises a phosphor that absorbs blue light and re-emits a different wavelength of light, said lamp emitting a perceived white light combination of blue LED light and conversion material light.

8. The lamp of claim 1, said phosphor carrier mounted over an opening in said optical cavity, with light from said light source passing through said phosphor carrier.

9. The lamp of claim 8, wherein said optical cavity comprises reflective surfaces.

10. A light emitting diode (LED) based lamp, comprising:
  an LED light source;
  a planar phosphor remote to said light source such that light emitted from said light source passes through said phosphor and is converted by said phosphor;
  a heat sink which forms the walls of an optical cavity, said light source mounted within said cavity;
  wherein said planar phosphor comprises a phosphor carrier and said phosphor carrier comprises a phosphor layer and a carrier layer and, said carrier layer comprising a first surface adjacent said phosphor layer and a second surface opposite said phosphor layer, wherein a portion of said first surface is uncovered by said phosphor layer; and a thermally conductive path to conduct phosphor conversion heat away from said planar phosphor and to dissipate said heat, wherein a portion of said first surface is uncovered by said phosphor layer, said uncovered portion of said first surface contacting said thermally conductive path, wherein said first surface of said carrier layer and said phosphor layer are adjacent to said thermally conductive path and said second surface of said carrier layer is opposite said thermally conductive path.

11. The lamp of claim 10, said thermally conductive path at least partially comprising said heat sink.

12. The lamp of claim 10, wherein said phosphor carrier comprises a thermally conductive transparent material.

13. The lamp of claim 10, further comprising scattering particles.

14. The lamp of claim 10, wherein said light source comprises a blue emitting LED and said phosphor layer absorbs blue light and re-emits a different wavelength of light, said lamp emitting a perceived white light combination of blue LED light and phosphor light.

15. The lamp of claim 10, said planar phosphor over an opening in said cavity, with light from said light source passing through said planar phosphor.

16. The lamp of claim 15, wherein said optical cavity comprises reflective surfaces.

17. A lamp, comprising:
  a heat sink structure comprising fins, said heat sink structure forming an optical cavity;
  a light emitting diode (LED) based light source in said cavity;
  a conversion material comprising a planar phosphor layer and a carrier layer, said carrier layer comprising a first surface adjacent to said phosphor layer and a second surface opposite said phosphor layer, said conversion material remote to said light source and which absorbs light from said light source and re-emits light in different wavelengths, such that said fins extend from said optical cavity in a direction parallel to said planar phosphor layer, wherein a portion of said first surface is uncovered by said phosphor layer, said uncovered portion of said first surface contacting said heat sink such that said first surface of said carrier layer and said phosphor layer is adjacent to said heat sink and said second surface of said carrier layer is opposite said heat sink; and
  a first thermally conductive path to conduct conversion generated heat away from said conversion material to said heat sink;
  wherein said planar phosphor layer is between said light source and said carrier layer.

18. The lamp of claim 17, said conversion material on an optical cavity opening, with light from said light source passing through said conversion material.

19. The lamp of claim 18, further comprising a platform within said optical cavity, said light source mounted on said cavity with heat dissipating from said light source through said platform.

20. The lamp of claim 18, wherein said optical cavity comprises reflective surfaces.

21. The lamp of claim 17, wherein heat from said first light source is conducted away from said light source through a second thermally conductive path.

22. The lamp of claim 21, wherein said first and second thermally conductive paths are coupled.

23. The lamp of claim 21, wherein said first and second thermally conductive paths are de-coupled.

* * * * *